(12) United States Patent
Hsu et al.

(10) Patent No.: US 7,781,550 B1
(45) Date of Patent: Aug. 24, 2010

(54) CHARGE TRANSPORT COMPOSITIONS AND THEIR USE IN ELECTRONIC DEVICES

(75) Inventors: Che-Hsiung Hsu, Wilmington, DE (US); Nora Sabina Radu, Landenberg, PA (US); Mark Andrew Harmer, Kennett Square, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 1197 days.

(21) Appl. No.: 11/302,776

(22) Filed: Dec. 14, 2005

Related U.S. Application Data

(60) Provisional application No. 60/640,541, filed on Dec. 30, 2004, provisional application No. 60/694,397, filed on Jun. 27, 2005.

(51) Int. Cl.
C08F 28/06 (2006.01)
C08F 12/30 (2006.01)

(52) U.S. Cl. .................. 526/256; 526/289

(58) Field of Classification Search .......... 526/256, 526/289
See application file for complete search history.

(56) References Cited

U.S. PATENT DOCUMENTS

| | | | | |
|---|---|---|---|---|
| 5,728,801 A | 3/1998 | Wu et al. | ............... | 528/422 |
| 5,834,100 A * | 11/1998 | Marks et al. | ............... | 428/209 |
| 6,303,238 B1 | 10/2001 | Thompson et al. | ............... | 428/690 |
| 2001/0019782 A1 | 9/2001 | Igarashi et al. | ............... | 428/690 |
| 2005/0158579 A1 * | 7/2005 | Marks et al. | ............... | 428/690 |
| 2005/0227465 A1 | 10/2005 | Smith et al. | ............... | 438/579 |

FOREIGN PATENT DOCUMENTS

| | | |
|---|---|---|
| EP | 1 191 612 A2 | 3/2002 |
| EP | 1 191 614 A2 | 3/2002 |
| WO | WO 00/70655 | 11/2000 |
| WO | WO 01/41512 A1 | 6/2001 |
| WO | WO 02/02714 A2 | 1/2002 |
| WO | WO 02/15645 A1 | 2/2002 |

OTHER PUBLICATIONS

Gustafsson, G. et al., "Flexible Light-Emitting Diodes made from Soluble Conducting Polymer", *Nature*, 1992, 357, 477-479.
O'Brien, D.F. et al., "Electrophosphoresence from a Doped Polymer Light Emitting Diode", *Synthetic Metals*, 2001, 116(1-3), 379-383.
Campbell, I.H. et al., "Excitation Transfer Processes in a phosphor-doped poly (*p*-phenylene vinylene) Light-Emitting Diode" *Physical Review B*, 65, 085210-1-085210-8 (2002).
Othmer, K., *Encyclopedia of Chemical Technology*, 1996, 18 (4th Ed), 837-860.
Dimitrakopoulos, C.D., et al., "Organic thin Film transistors for Large Area Electronics", *Adv. Mater.*, 2002, 14(2), 99-117.
Cui, J. et al., "Interfacial Microstructure Function in Organic Light-Emitting Diodes: Assembled Tetraaryldiamine and Copper Phthalocyanine Interlayers", *Adv. Mater.*, 2002, 14(8), 565-569.
Yan, H. et al., "A Polymer Blend Approach to Fabricating the Hole Transport Layer for Polymer Light-Emitting Diodes", *Applied Physics Letters*, 2004, 84(19), 3873-3875.

* cited by examiner

*Primary Examiner*—William K Cheung
(74) *Attorney, Agent, or Firm*—Wookcock Washburn LLP

(57) ABSTRACT

Disclosed are compositions comprising:

at least one monomer of the formula:
-continued
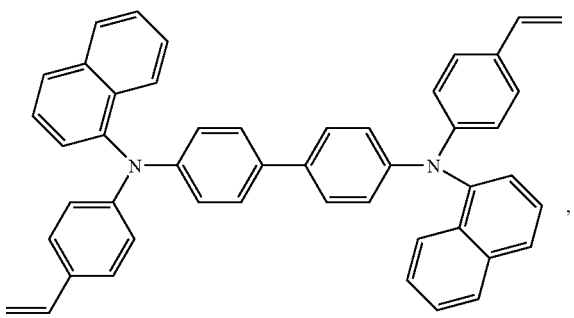
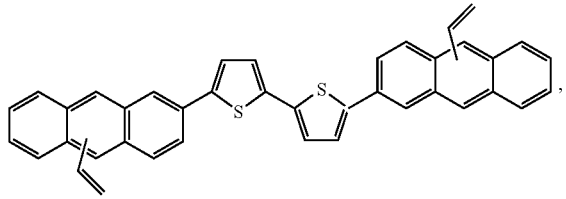
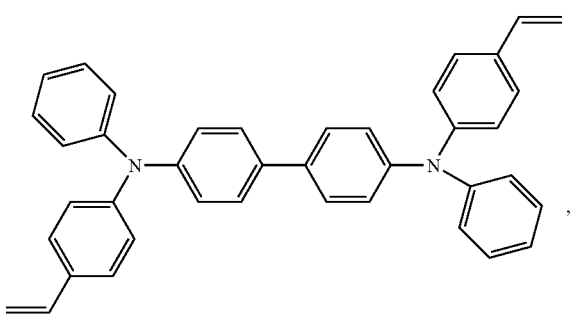
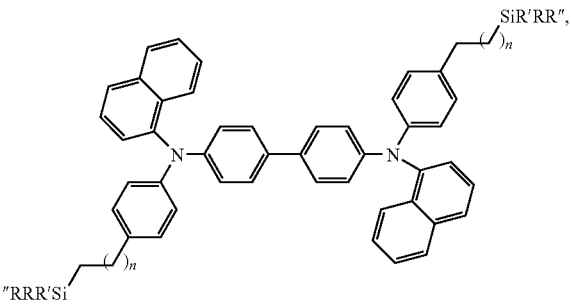
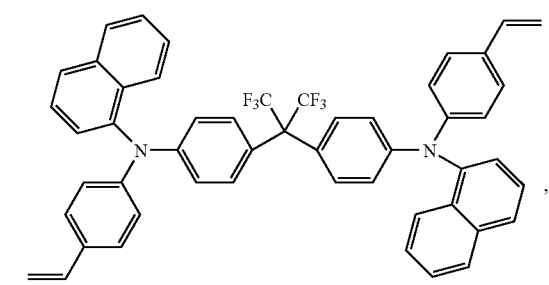
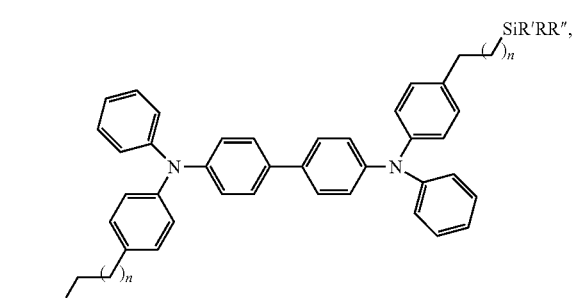
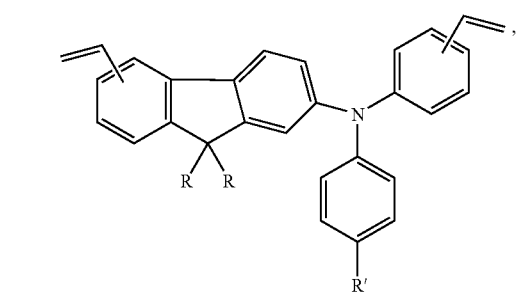
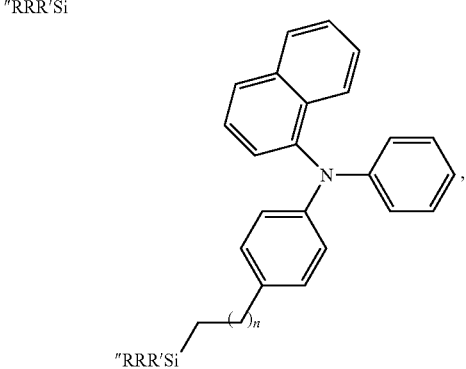
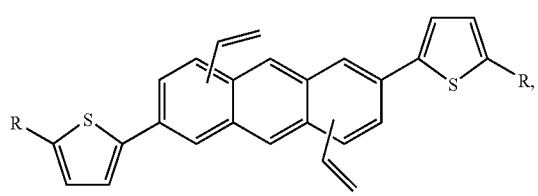
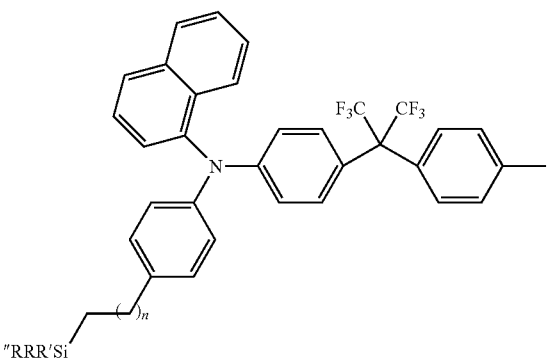

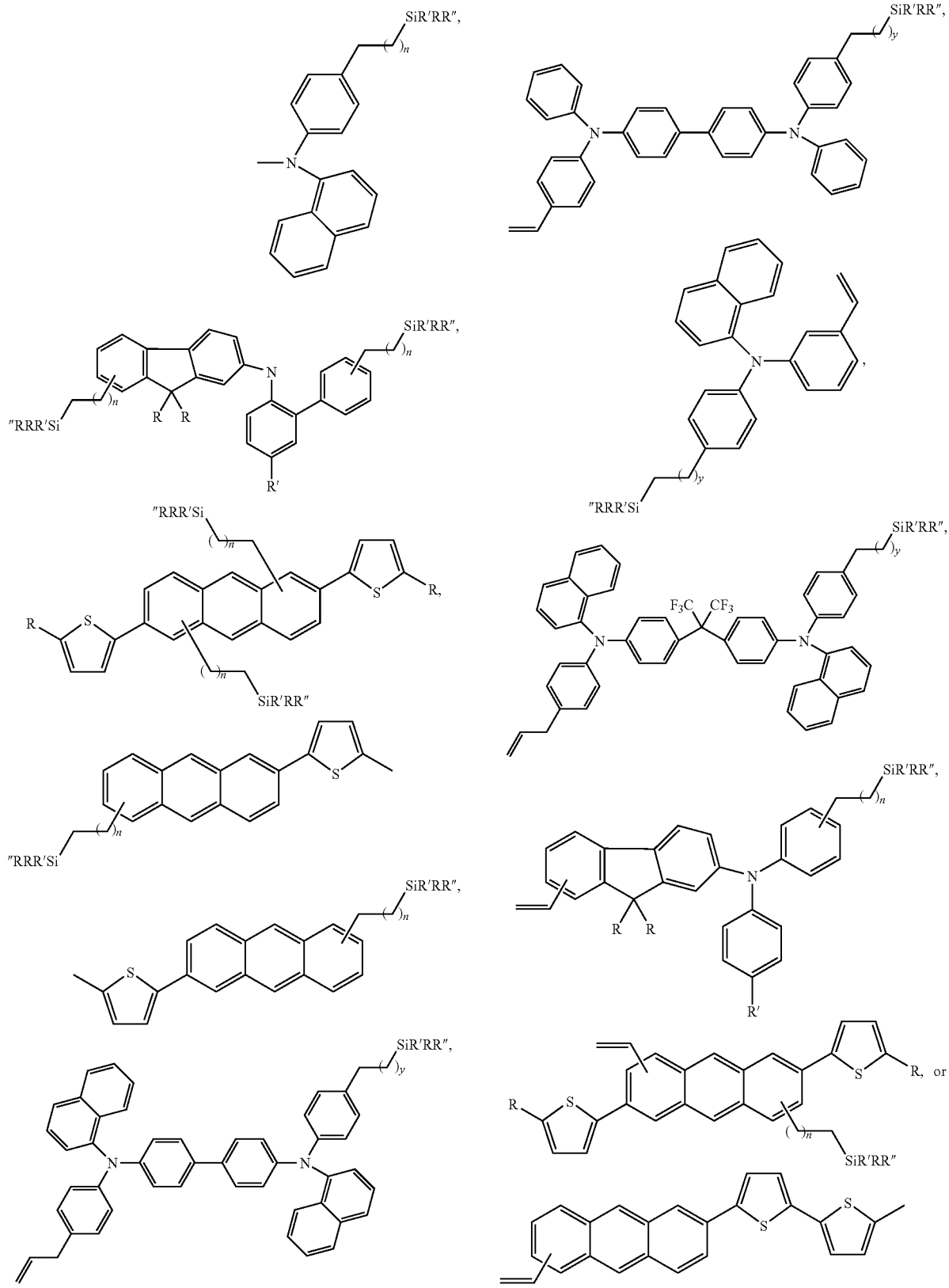

-continued
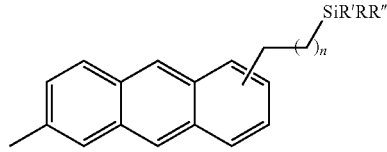
where SiR'RR" is SiCl$_3$, Si(alkyl)Cl$_2$, Si(alkyl)(O-alkyl)$_2$, or Si(O-alkyl)$_3$; n and y are each 0 or an integer from 1 to 10; and
at least one particle comprising silica, alumina, zirconia, or mixtures thereof.
23 Claims, 1 Drawing Sheet

CHARGE TRANSPORT COMPOSITIONS AND THEIR USE IN ELECTRONIC DEVICES

CROSS-REFERENCE TO RELATED APPLICATIONS

The present application claims benefit to U.S. Provisional Application Ser. Nos. 60/640,541, filed Dec. 30, 2004 and 60/694,397, filed Jun. 27, 2005, each of which are incorporated herein by reference in their entireties.

FIELD OF THE DISCLOSURE

This disclosure relates generally to charge transport compositions, for example, those found in organic electronic devices, and materials and methods for fabrication of the same.

BACKGROUND INFORMATION

Organic electronic devices convert electrical energy into radiation, detect signals through electronic processes, convert radiation into electrical energy, or include one or more organic semiconductor layers. Most organic electronic devices are constructed of multiple layers. Solution processable materials offer a potential advantage from a cost and manufacturing standpoint. However, sequential deposition of layers from solution requires that each layer that is formed remains intact upon deposition of subsequent layers.

Thus, what is needed is novel charge transport materials useful in the manufacture of organic electronic devices.

SUMMARY

In one embodiment, compositions comprising:
at least one monomer of the formula:

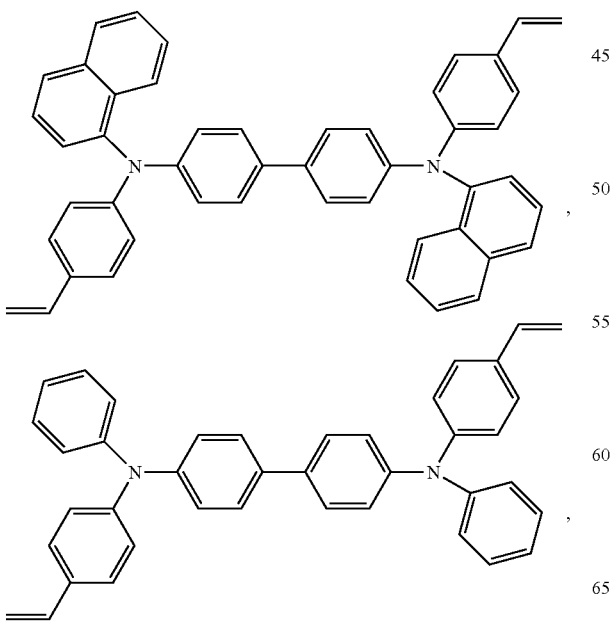

-continued

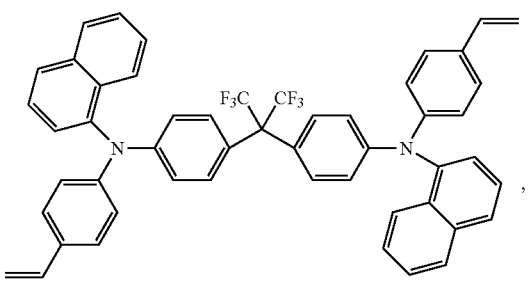

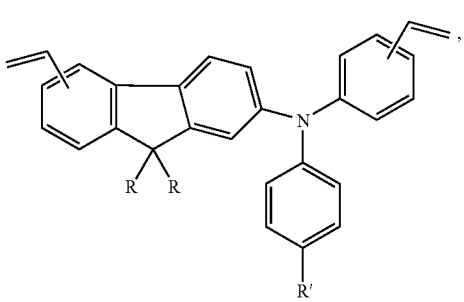

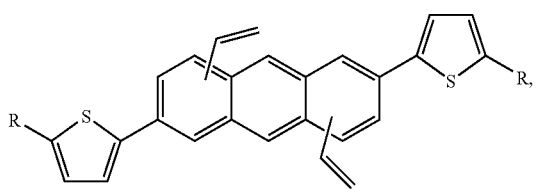

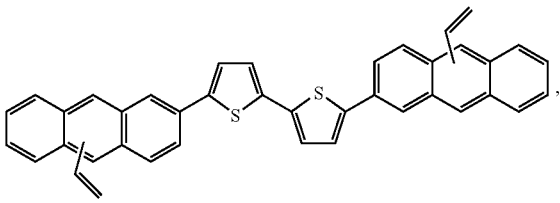

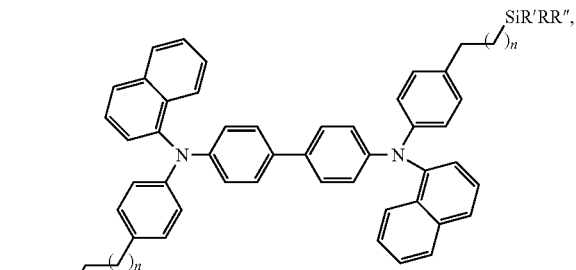

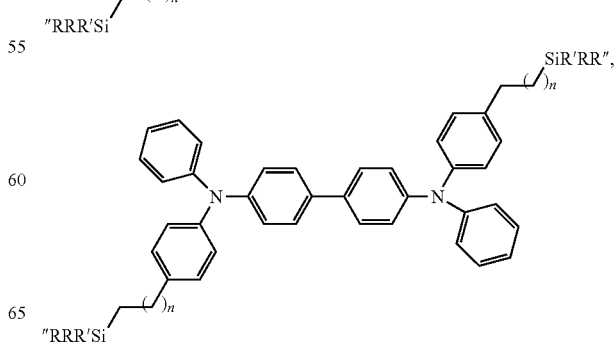

-continued
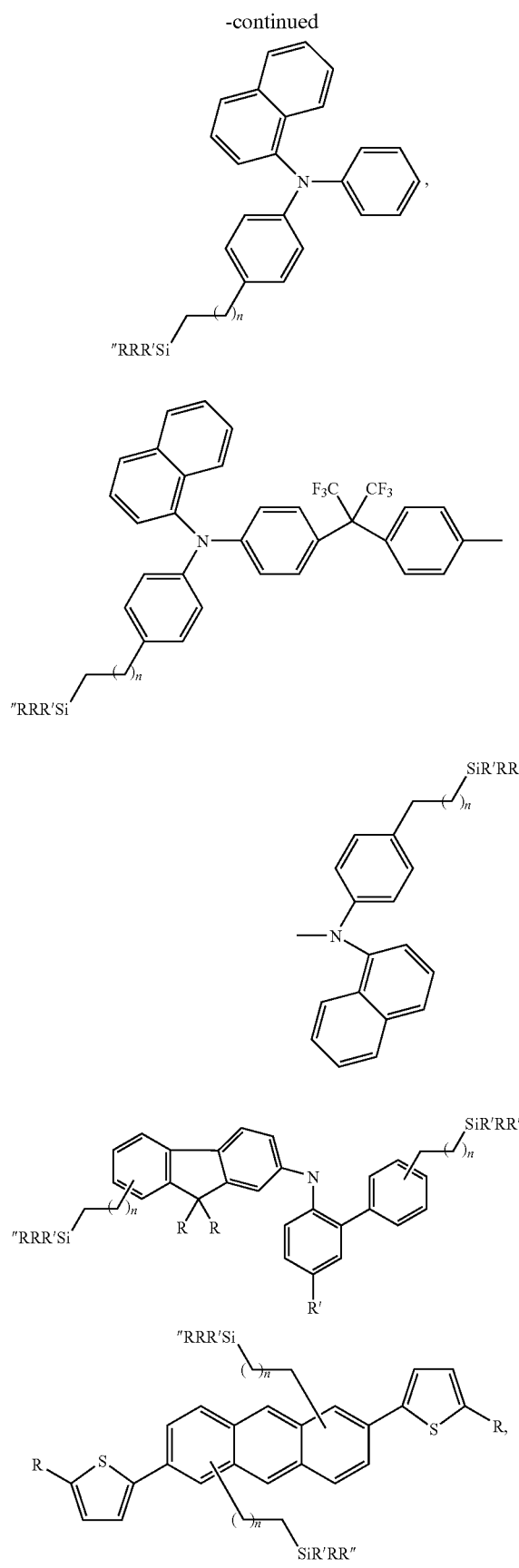
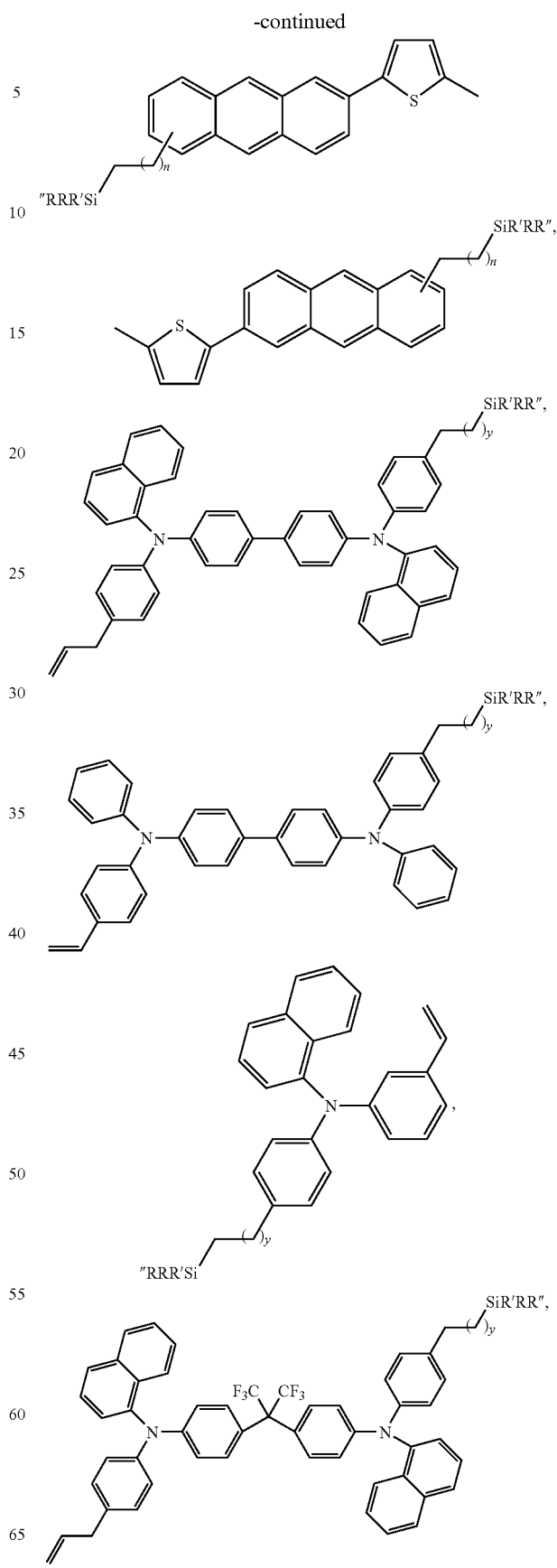

-continued

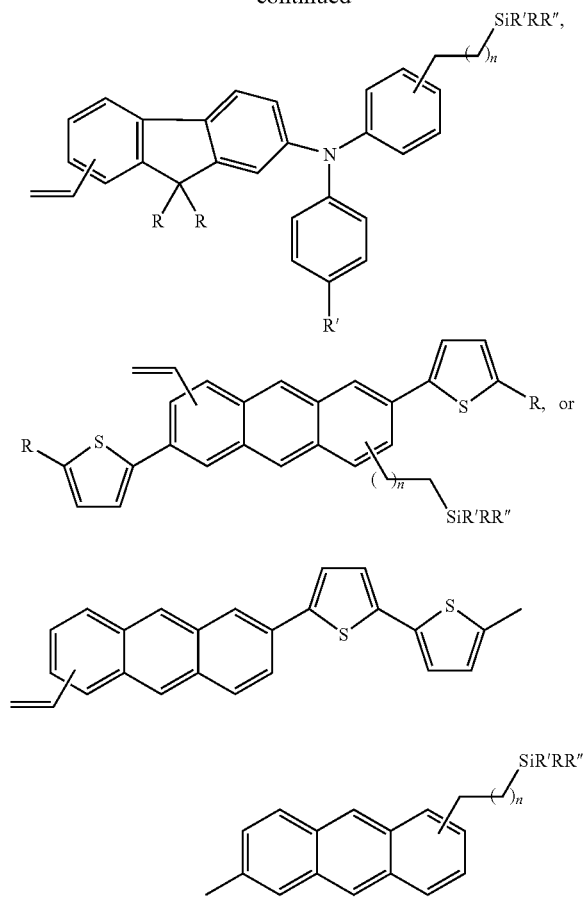

where SiR'RR" is SiCl$_3$, Si(alkyl)Cl$_2$, Si(alkyl)(O-alkyl)$_2$, or Si(O-alkyl)$_3$; n and y are each 0 or an integer from 1 to 10; and at least one particle comprising silica, alumina, zirconia, or mixtures thereof are provided, and methods for making the same, as well as devices and sub-assemblies including the same.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figure to improve understanding of concepts as presented herein.

Figure 1:
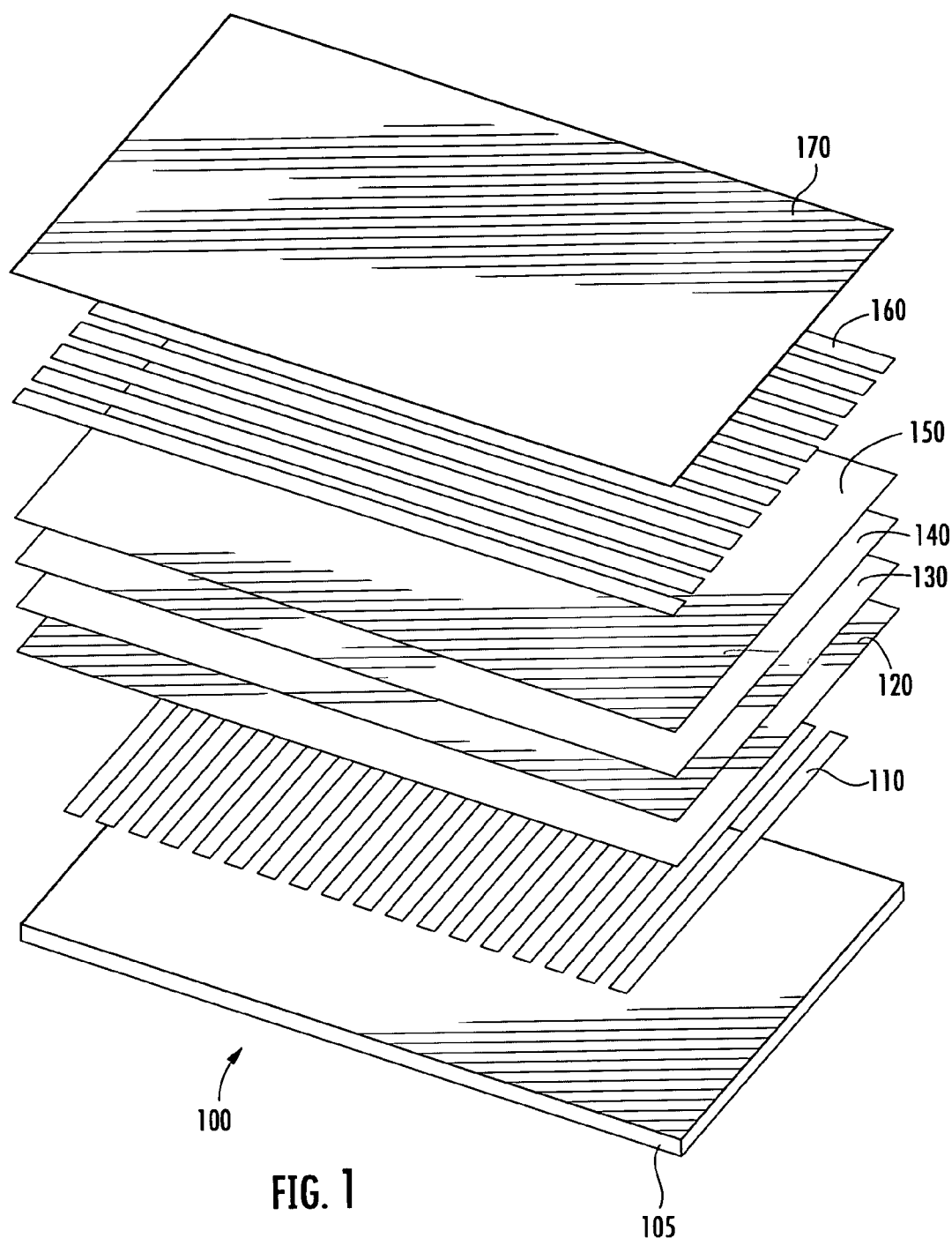
FIG. 1 includes an illustration of one illustrative organic electronic device that may include one layer that comprises at lease one compound made by a method disclosed herein.

The figures are provided by way of example and are not intended to limit the invention. Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

In one embodiment, provided are compositions comprising:

at least one monomer of the formula:

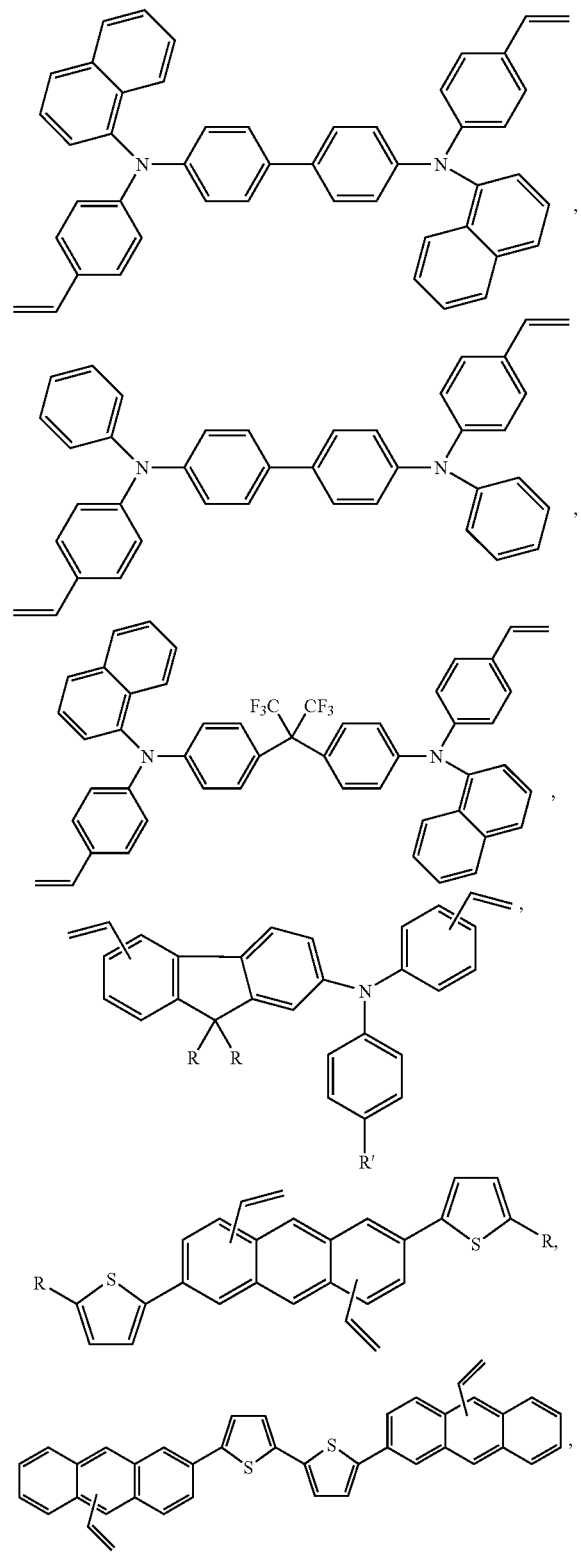

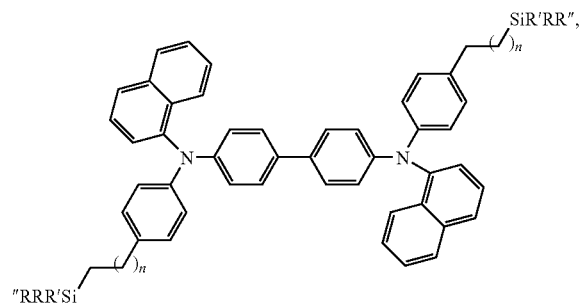
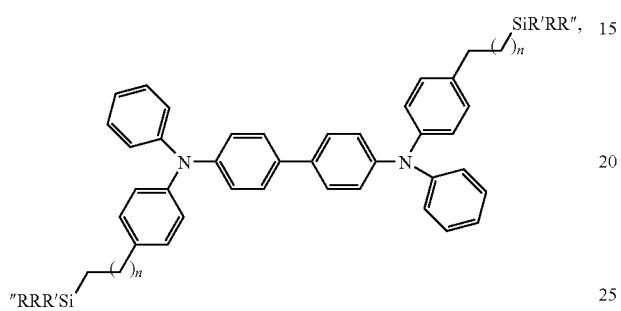
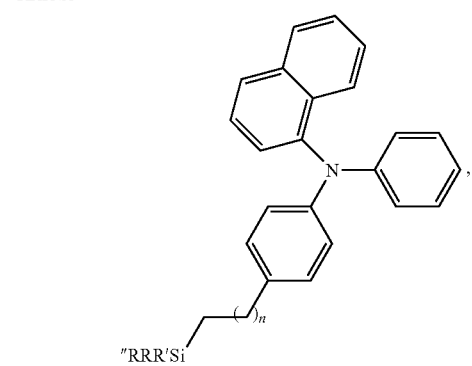
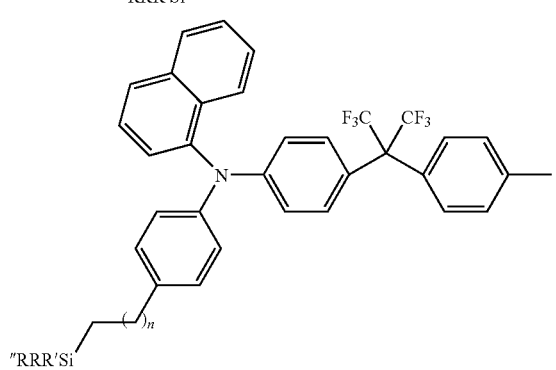
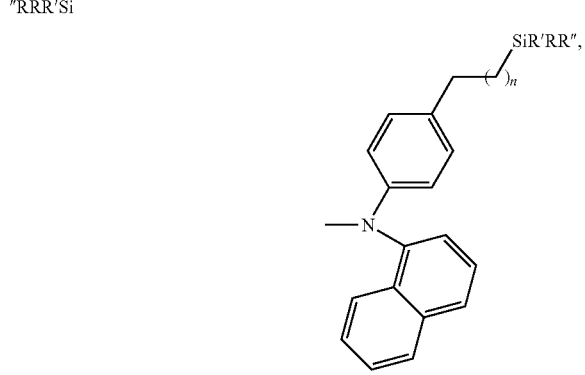

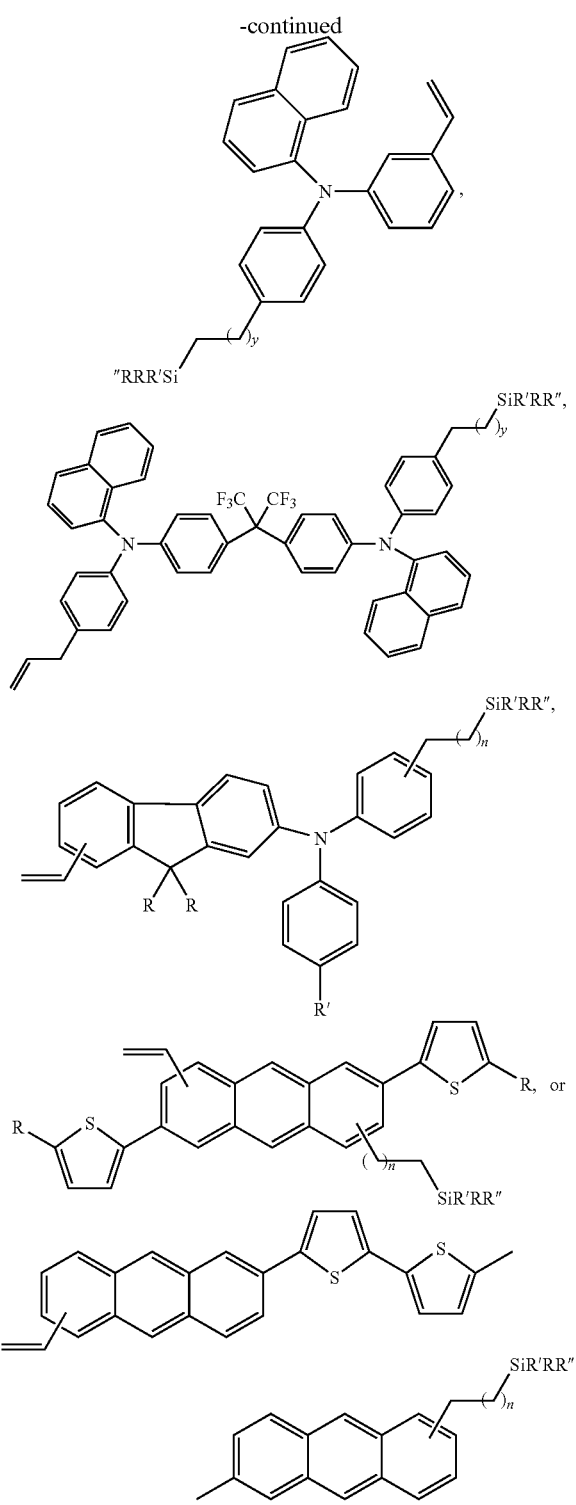

where SiR'RR" is SiCl$_3$, Si(alkyl)Cl$_2$, Si(alkyl)(O-alkyl)$_2$, or Si(O-alkyl)$_3$; n and y are each 0 or an integer from 1 to 10; and at least one particle comprising silica, alumina, zirconia, or mixtures thereof.

In one embodiment, the particle is silica.

Particles contemplated for use include nanoparticles. These particles may have a variety of shapes and sizes and mixtures of shapes and sizes. In one embodiment, the nanoparticles are substantially spherical. In one embodiment, the nanoparticles are substantially elongated. Nanoparticles contemplated for use in the new composition typically have an average particle diameter less than about 100 nm. In one embodiment, the nanoparticles have an average particle diameter less than about 50 nm. In one embodiment, the nanoparticles have an average particle diameter less than about 10 nm.

In one embodiment, the aspect ratio of elongated nanoparticles is greater than 1 to 100. Aspect ratio is defined as ratio of particle width to particle length. For elongated particles, the "particle size" is considered to be the particle width. In one embodiment, the nano-particles have an irregular geometry. For irregularly-shaped particles, the "particle size" is considered to be size of the smallest screen opening through which the particle will pass.

In one embodiment, the nanoparticle is an inorganic oxide comprising silica, alumina, or zirconia or mixtures and combinations thereof. In one embodiment, the monomer crosslinks with other of said monomers and substantially in the absence of the inorganic oxide.

Also provided are compositions comprising a polymer that either forms the particle substantially in the absence of inorganic particles or the polymer forms a coating on at least a portion of an inorganic oxide particle. In certain embodiments, the compositions comprise an inorganic oxide particle that is silica, alumina, zirconia, or mixtures thereof.

In one embodiment, electronic devices which comprise at least one layer which comprises at least one compound made by the methods described herein are provided.

One embodiment concerns compositions comprising a composition described herein and at least one solvent, processing aid, charge transporting material, or charge blocking material.

One embodiment, concerns methods of forming a crosslinked charge transport material comprising:

a. providing a cross-linkable charge transport monomer; and b. causing said monomer to crosslink optionally in the presence of inorganic oxide particles. One embodiment utilizes monomers disclosed herein.

In one embodiment, the charge transport material functions as a hole transport material.

In one embodiment, provided are an electronic device comprising an anode; a hole transport layer; an active layer, an electron transport layer, and a cathode wherein the hole transport layer comprises a hole transport material made by a process comprising:

a. providing a cross-linkable hole transport monomer; and b. causing said monomer to crosslink to the surface of an inorganic oxide particles or to crosslink with other monomers to form particles. In some embodiments, substantially all of the monomers are reacted. In certain embodiments, the particles are nanoparticles.

In one embodiment, the invention concerns a composition of comprising a hole transport material of the invention and at least one solvent, processing aid, charge transporting material, or charge blocking material.

In one embodiment, the charge transporting materials are hole-transporting materials (HTM). The reformed crosslinked HTM nanoparticles are dispersible in either aqueous electrically conducting polymer (ECP) dispersion or in electroluminescence material solution for creating a HTM interface layer. The interface layer can be formed on the upper side of an electrically conducting polymer layer cast on an anode from an aqueous dispersion containing the electrically conducting polymer and crosslinked HTM nanoparticles. The electrically conducting polymer layer in contact with the anode can function as a hole injection layer. In another embodiment, the HTM interface layer can be formed on an electrically conducting polymer layer from an organic solution of an electroluminescent ("EL") material containing crosslinked HTM nanoparticles.

In one embodiment, a pre-polymer is built inside the pore structure of the inorganic support. The polymer is then formed within the inorganic support and is highly dispersed and trapped within the support.

Certain HTM materials are reported in U.S. Pat. No. 5,728, 801, and U.S. Published Application No. 20050227465, the disclosure of which is incorporated herein by reference.

HTMs also include hybrid acene-thiophene oligomers or small molecules such as 5,5'-bis-(2-tetracenyl, or 2-anthracenyl)-2,2'-bi-thiophene and its derivatives, and bis-(thiophene-2'-yl)-2,6,anthracene and its organic-solvent soluble derivatives.

In one embodiment, imbibition of a blend in nanoparticles of inorganic oxides is followed by thermal or photochemical crosslinking of a material reactive to inorganic oxide surface. For example, a solution blend of 4,4'-bis[(p-trichlorosilylpropylphenyl)phenylamino]biphenyl and a hole-transporting polymer such as poly(9,9-dioctylfluorene-co-N-(4-butylphenyl)diphenylamine, or hybrid acene-thiophene oligomers or small molecules such as 5,5'-bis-(2-tetracenyl, or 2-anthracenyl)-2,2'-bi-alkylthiophene, bis-(5'-hexylthiophene-2'-yl)-2, 6,anthracene and its derivatives.

In one embodiment, the crosslinkable HTMs are fluorinated.

Also provided is a method of making colloidal HTMs involving fluidization of HTM-imbibed nanoparticles in a crosslinking reaction temperature bath to ensure separation of the nanoparticles during crosslinking reaction.

One embodiment concerns jetting a solution of crosslinkable molecules or a blend of crosslinkable molecules to a fluidization bath at a crosslinking reaction temperature.

In one embodiment, compositions are provided comprising the above-described compounds and at least one solvent, processing aid, charge transporting material, or charge blocking material. These compositions can be in any form, including, but not limited to, solvents, emulsions, and colloidal dispersions.

Use of the some embodiments is applicable to any solution patterning method and device used in the art for making such layers. These devices use a variety of techniques, including sequentially depositing the individual layers on a suitable substrate. Substrates such as glass and polymeric films can be used. Conventional vapor deposition techniques can be used, such as thermal evaporation, chemical vapor deposition, and the like. Alternatively, the organic layers can be applied by liquid deposition using suitable solvents. The liquid can be in the form of solutions, dispersions, or emulsions. Typical liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink jet printing, gravure printing, and screen printing, Any conventional coating or printing techniques can be employed, including but not limited to spin-coating, dip-coating, roll-to-roll techniques, ink-jet printing, screen-printing, gravure printing and the like. In some embodiments, an ink jet printing method is preferred. In other embodiments, a nozzle printer application is preferred.

Any solvent may be used that solubilizes the materials utilized. In some embodiments, the solvent is preferably an aprotic solvent. In one embodiment, the solvent is an aromatic hydrocarbon. In one embodiment, the aprotic organic solvent is toluene, xylene, mesitylene, anisole, chlorobenzene, cyclohexanone, gamma-valerolactone, or chloroform, or derivatives thereof. In one embodiment, the solvent is preferably toluene.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms, Illustrative Organic Electronic Devices, followed by the Examples.

1. Definitions and Clarification of Terms

Before addressing details of embodiments described below, some terms are defined or clarified.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true' (or present).

The use of "a" or "an" are employed to describe elements and components of the invention. This is done merely for convenience and to give a general sense of the invention. This description should be read to include one or at least one and the singular also includes the plural unless it is obvious that it is meant otherwise.

The term "layer" is used interchangeably with the term "film" and refers to a coating covering a desired area. The area can be as large as an entire device or a specific functional area such as the actual visual display, or as small as a single sub-pixel. Films can be formed by any conventional deposition technique, including vapor deposition and liquid deposition. Liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink jet printing, gravure printing, and screen printing.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode). The term device also includes coating materials for memory storage devices, antistatic films, biosensors, electrochromic devices, solid electrolyte capacitors, energy storage devices such as a rechargeable battery, and electromagnetic shielding applications.

The term "substrate" is intended to mean a workpiece that can be either rigid or flexible and may include one or more layers of one or more materials, which can include, but are not limited to, glass, polymer, metal, or ceramic materials, or combinations thereof.

The term "active" when referring to a layer or material is intended to mean a layer or material that exhibits electronic or electro-radiative properties. An active layer material may emit radiation or exhibit a change in concentration of electron-hole pairs when receiving radiation. Thus, the term "active material" refers to a material which electronically facilitates the operation of the device. Examples of active materials include, but are not limited to, materials which conduct, inject, transport, or block a charge, where the charge can be either an electron or a hole. Examples of inactive materials include, but are not limited to, planarization materials, insulating materials, and environmental barrier materials.

The term "alkyl" is intended to mean a group derived from an aliphatic hydrocarbon and includes a linear, a branched, or a cyclic group, which may be unsubstituted or substituted.

As used herein, the term "charge transport," when referring to a layer or material is intended to mean such layer or material facilitates migration of such charge through the thickness of such layer, material, member, or structure with relative efficiency and small loss of charge, and is meant to be broad enough to include materials that may act as a hole transport or an electron transport material. The term "electron transport" when referring to a layer or material means such a layer or material, member or structure that promotes or facilitates migration of electrons through such a layer or material into another layer, material, member or structure.

As used herein, the term "photoactive" refers to a material that emits light when activated by an applied voltage (such as in a light-emitting diode or light-emitting electrochemical cell), or responds to radiant energy and generates a signal with or without an applied bias voltage (such as in a photodetector).

Group numbers corresponding to columns within the Periodic Table of the elements use the "New Notation" convention as seen in the CRC Handbook of Chemistry and Physics, 81st Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Illustrative Organic Electronic Devices

Referring to FIG. 1, an exemplary organic electronic device 100 is shown. The device 100 includes a substrate 105. The substrate 105 may be rigid or flexible, for example, glass, ceramic, metal, or plastic. When voltage is applied, emitted light is visible through the substrate 105.

A first electrical contact layer 110 is deposited on the substrate 105. For illustrative purposes, the layer 110 is an anode layer. Anode layers may be deposited as lines. The anode can be made of, for example, materials containing or comprising metal, mixed metals, alloy, metal oxides or mixed-metal oxide. The anode may comprise a conducting polymer, polymer blend or polymer mixtures. Suitable metals include the Group 11 metals, the metals in Groups 4, 5, and 6, and the Group 8, 10 transition metals. If the anode is to be light-transmitting, mixed-metal oxides of Groups 12, 13 and 14 metals, such as indium-tin-oxide, are generally used. The anode may also comprise an organic material, especially a conducting polymer such as polyaniline, including exemplary materials as described in *Flexible Light-Emitting Diodes Made From Soluble Conducting Polymer, Nature* 1992, 357, 477-479. At least one of the anode and cathode should be at least partially transparent to allow the generated light to be observed.

An optional buffer layer 120, such as hole transport materials, may be deposited over the anode layer 110, the latter being sometimes referred to as the "hole-injecting contact layer." Examples of hole transport materials suitable for use as the layer 120 have been summarized, for example, in Kirk Othmer, Encyclopedia of Chemical Technology, Vol. 18, 837-860 ($4^{th}$ ed. 1996). Both hole transporting "small" molecules as well as oligomers and polymers may be used. Hole transporting molecules include, but are not limited to: N,N' diphenyl-N,N'-bis(3-methylphenyl)-[1,1'-biphenyl]-4,4'-diamine (TPD), 1,1 bis[(di-4-tolylamino) phenyl]cyclohexane (TAPC), N,N' bis(4-methylphenyl)-N,N'-bis(4-ethylphenyl)-[1,1'-(3,3'-dimethyl)biphenyl]-4,4'-diamine (ETPD), tetrakis (3-methylphenyl)-N,N,N',N'-2,5-phenylenediamine (PDA), α-phenyl 4-N,N-diphenylaminostyrene (TPS), p (diethylamino)benzaldehyde diphenylhydrazone (DEH), triphenylamine (TPA), bis[4(N,N-diethylamino)-2-methylphenyl](4-methylphenyl)methane (MPMP), 1 phenyl-3-[p-(diethylamino) styryl]-5-[p-(diethylamino)phenyl]pyrazoline (PPR or DEASP), 1,2 trans-bis(9H-carbazol-9-yl)cyclobutane (DCZB), N,N,N',N' tetrakis(4-methylphenyl)-(1,1'-biphenyl)-4,4'-diamine (TTB), and porphyrinic compounds, such as copper phthalocyanine. Useful hole transporting polymers include, but are not limited to, polyvinylcarbazole, (phenylmethyl)polysilane, and polyaniline. Conducting polymers are useful as a class. It is also possible to obtain hole transporting polymers by doping hole transporting moieties, such as those mentioned above, into polymers such as polystyrenes and polycarbonates.

An organic layer 130 may be deposited over the buffer layer 120 when present, or over the first electrical contact layer 110. In some embodiments, the organic layer 130 may be a number of discrete layers comprising a variety of components. Depending upon the application of the device, the organic layer 130 can be a light-emitting layer that is activated by an applied voltage (such as in a light-emitting diode or light-emitting electrochemical cell), or a layer of material that responds to radiant energy and generates a signal with or without an applied bias voltage (such as in a photodetector).

Other layers in the device can be made of any materials which are known to be useful in such layers upon consideration of the function to be served by such layers.

Any organic electroluminescent ("EL") material can be used as a photoactive material (e.g., in layer 130). Such materials include, but are not limited to, fluorescent dyes, small molecule organic fluorescent compounds, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In one embodiment of the devices of the invention, photoactive material can be an organometallic complex. In another embodiment, the photoactive material is a cyclometalated complex of iridium or platinum. Other useful photoactive materials may be employed as well. Complexes of iridium with phenylpyridine, phenylquinoline, or phenylpyrimidine ligands have been disclosed as electroluminescent compounds in Petrov et al., Published PCT Application WO 02/02714. Other organometallic complexes have been described in, for example, published applications US 2001/0019782, EP 1191612, WO 02/15645, and EP 1191614. Electroluminescent devices with an active layer of polyvinyl carbazole (PVK) doped with metallic complexes of iridium have been described by Burrows and Thompson in published PCT applications WO 00/70655 and WO 01/41512. Electroluminescent emissive layers comprising a charge carrying host material and a phosphorescent platinum complex have been described by Thompson et al., in U.S. Pat. No. 6,303,238, Bradley et al., in *Synth. Met.* 2001, 116 (1-3), 379-383, and Campbell et al., in Phys. Rev. B, Vol. 65 085210.

A second electrical contact layer 160 is deposited on the organic layer 130. For illustrative purposes, the layer 160 is a cathode layer.

Cathode layers may be deposited as lines or as a film. The cathode can be any metal or nonmetal having a lower work function than the anode. Exemplary materials for the cathode can include alkali metals, especially lithium, the Group 2 (alkaline earth) metals, the Group 12 metals, including the rare earth elements and lanthanides, and the actinides. Materials such as aluminum, indium, calcium, barium, samarium and magnesium, as well as combinations, can be used. Lithium-containing and other compounds, such as LiF and $Li_2O$, may also be deposited between an organic layer and the cathode layer to lower the operating voltage of the system.

An electron transport layer 140 or electron injection layer 150 is optionally disposed adjacent to the cathode, the cathode being sometimes referred to as the "electron-injecting contact layer."

An encapsulation layer 170 is deposited over the contact layer 160 to prevent entry of undesirable components, such as water and oxygen, into the device 100. Such components can have a deleterious effect on the organic layer 130. In one embodiment, the encapsulation layer 170 is a barrier layer or film.

Though not depicted, it is understood that the device 100 may comprise additional layers. For example, there can be a layer (not shown) between the anode 110 and hole transport layer 120 to facilitate positive charge transport and/or bandgap matching of the layers, or to function as a protective layer. Other layers that are known in the art or otherwise may be used. In addition, any of the above-described layers may comprise two or more sub-layers or may form a laminar structure. Alternatively, some or all of anode layer 110 the hole transport layer 120, the electron transport layers 140 and 150, cathode layer 160, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 110, 500-5000 Å, in one embodiment 1000-2000 Å; hole transport layer 120, 50-2000 Å, in one embodiment 200-1000 Å; photoactive layer 130, 10-2000 Å, in one embodiment 100-1000 Å; layers 140 and 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

Devices can be prepared employing a variety of techniques. These include, by way of non-limiting exemplification, vapor deposition techniques and liquid deposition. Devices may also be sub-assembled into separate articles of manufacture that can then be combined to form the device.

EXAMPLES

The concepts described herein will be further described in the following examples, which do not limit the scope of the invention described in the claims.

Example 1

This example illustrates a composition of a colloidal HTM using a solution blend of 4,4'-bis[(p-trichlorosilyl-propylphenyl)phenylamino]biphenyl and a hole-transporting polymer of poly(9,9-dioctylfluorene-co-N-(4-butylphenyl)diphenylamine and the process of making it.

A solution blend of 4,4'-bis[(p-trichlorosilyl-propylphenyl)phenylamino]biphenyl and a hole-transporting polymer of poly (9,9-dioctylfluorene-co-N-(4-butylphenyl)diphenylamine for spin-coating on ITO (indium-tin oxide) as a hole transporting layer can be made as described in Applied Physics Letters, 84, 3873-3875, May 2004. Once subjected to thermal heat-treatment, the layer is not dissolved during spin coating of an electro luminescent layer polymer.

This example illustrates imbibition of the solution blend on silica nano-particles having primary particles in the range of <10 nm. The imbibition will be carried out by immersing the particles in the solution blends. The imbibed particles will be fluidized in a fluidization bath having a set-temperature of about 100° C. for 10 minutes to one hour. The fluidization will ensure separation of nanoparticles during crosslinking reaction of the imbibed HTM.

The silica nanoparticles imbibed with the crosslinked HTM will be experimented for dispersibility in either an aqueous electrically conducting polymer dispersion or electroluminescent layer polymer dispersion:

Example 2

This example illustrates a composition of a colloidal HTM using a solution blend of 4,4'-bis[(p-trichlorosilyl-propylphenyl)phenylamino]biphenyl and a hole-transporting material of small molecule of hybrid acene-thiophene and a process of making it.

Hybrid acene-thiophene molecules of organic semiconductors such as 5,5'-bis-(2-tetracenyl, or 2-anthracenyl)-2,2'-bi-thiophene, and bis-(5'-lthiophene-2'-yl)-2,6,anthracene are can be made as described in Adv. Mater. 14, 99-117, 2002. These molecules have high mobility usually in the range of 0.1 cm²/Vs.

This example illustrates imbibition of a solution blend of 4,4'-bis[(p-trichlorosilyl-propylphenyl)phenylamino]biphenyl and a hole-transporting small molecule of bis-(5'-hexy-lthiophene-2'-yl)-2,6,anthracene on silica nanoparticles having primary particles in the range of <10 nm. The imbibition will be carried out immersing the particles in the solution blends. The imbibed particles will be fluidized in a fluidization bath having a set-temperature of about 100° C. for 10 minutes to one hour. The fluidization will ensure separation of nanoparticles during crosslinking reaction of the imbibed HTM. The silica nanoparticles imbibed with the crosslinked HTM can be tested for the solubility of the HTM in an organic solution of an eletroluminescent polymer. The compounds can also be tested for dispersibility in either an aqueous electrically conducting polymer dispersion or electroluminescent layer polymer dispersion.

Example 3

This example illustrates formation of HTMs within the pore structure of an inorganic support.

A pre-polymer can be imbibed on the inside and on the pore structure of an inorganic support. The polymer is then formed within the inorganic support and is highly dispersed and trapped within the support.

A general scheme of chemistry and a list of some possible hole-transporting materials are listed below. Scheme I illustrates certain aspects of this invention.

Scheme I

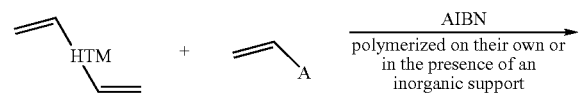

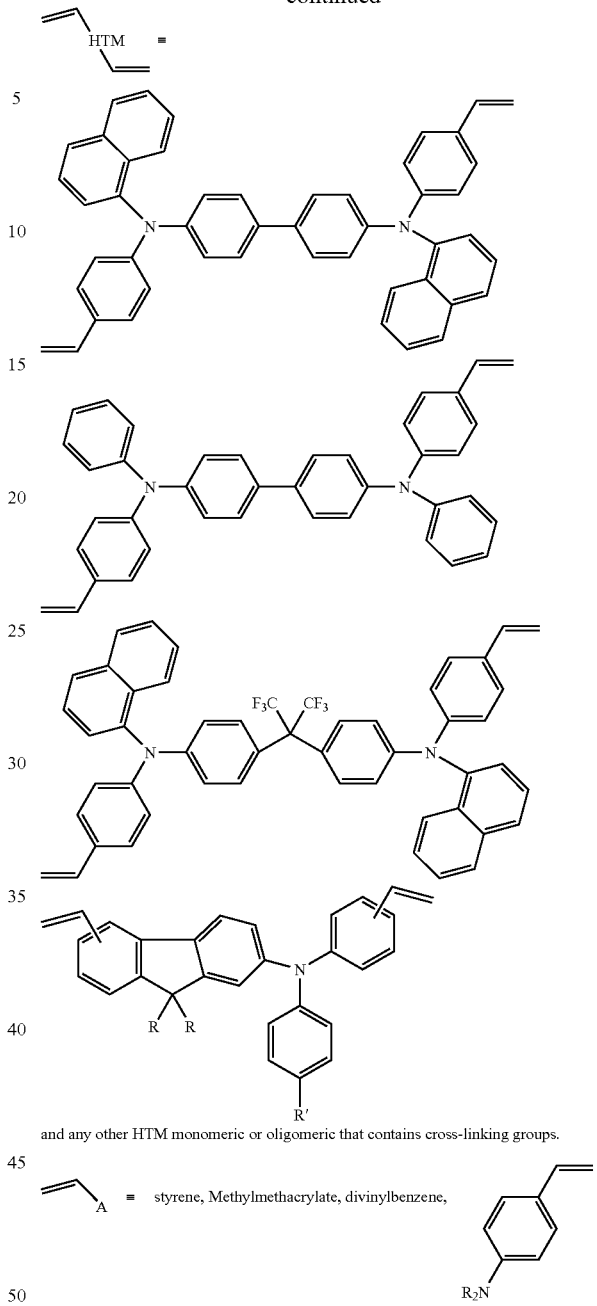

and any other HTM monomeric or oligomeric that contains cross-linking groups.

A specific example is illustrated below:

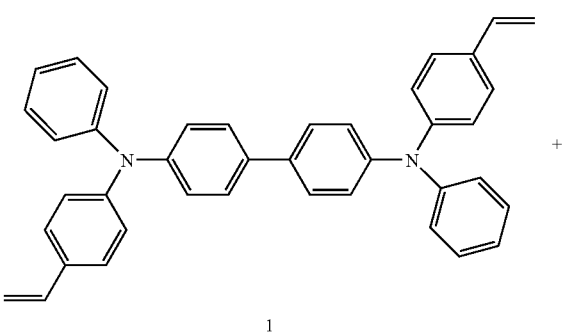

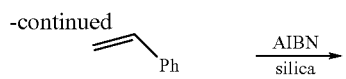

Synthesis of Compound 1.

4-Bromostyrene (10.16 g, 55.5 mmol) was added dropwise to a mixture of diphenylbenzidine (6.22 g, 18.5 mmol), NaO$^t$Bu (5.33 g, 55.5 mmol), Pd$_2$(dba)$_3$ (0.85 g, 0.925 mmol) and P($^t$Bu)$_3$ (0.19 g, 0.925 mmol) in toluene (250 mL) and stirred for 22 hours. The resulting mixture was filtered through celite and silica and the solvent evaporated to obtain a dark viscous material which was purified by precipitation into methanol from dichloromethane and chromatography (dichloromethane/hexanes 1/4) yielding a pale yellow powder (2.63 g, 26%). $^1$H NMR (CD$_2$Cl$_2$, 500 MHz) δ 7.48 (4H, d, J=8.6 Hz, Ar—H), 7.32 (4H, d, J=8.5 Hz, Ar—H), 7.28 (4H, t, J=7.8 Hz, Ar—H), 7.13-7.11 (8H, m, Ar—H), 7.07-7.04 (6H, m, Ar—H), 6.69 (2H, dd, J=17.6, 11.3 Hz, =CH), 5.66 (2H, dd, J=17.6, 0.8 Hz, =CH$_2$ (cis)), 5.17 (2H, d, J=11.3 Hz, =CH$_2$ ($^t$rans)).

Polymerization of compound 1 with styrene in presence of silica: A mixture of 1 (1.00 g, 1.8 mmol), styrene (0.2 g), AIBN (10 mg), and nanoparticles of silica (1.0 g) will be mixed in THF. The nanoparticles of silica imbibed with compound 1, styrene and AIBN will be fluidized in a nitrogen fluidization bath having a set-temperature of about 70° C. for a time sufficient to render the HTM insoluble in an organic solvent. The fluidization will ensure separation of nanoparticles during crosslinking reaction of the imbibed HTM.

Example 4

This example illustrates the binding of polymers to the inorganic support.

This example is similar to Example 3, however, one of the co-monomers incorporates attachment groups, which can bind to the inorganic support and chemically entrap resulting polymer or polymerize their own to form a HTM colloids. Three variations are shown below.

In Scheme II, a general scheme of chemistry and a list of possible hole-transporting materials, which form vinyl-siloxane, are listed.

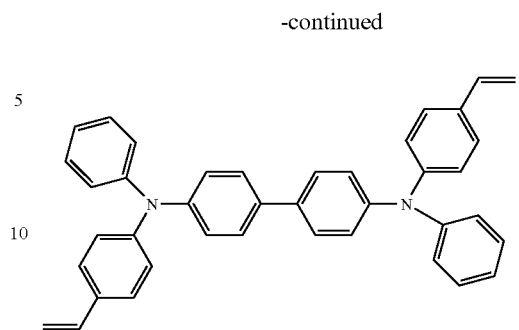

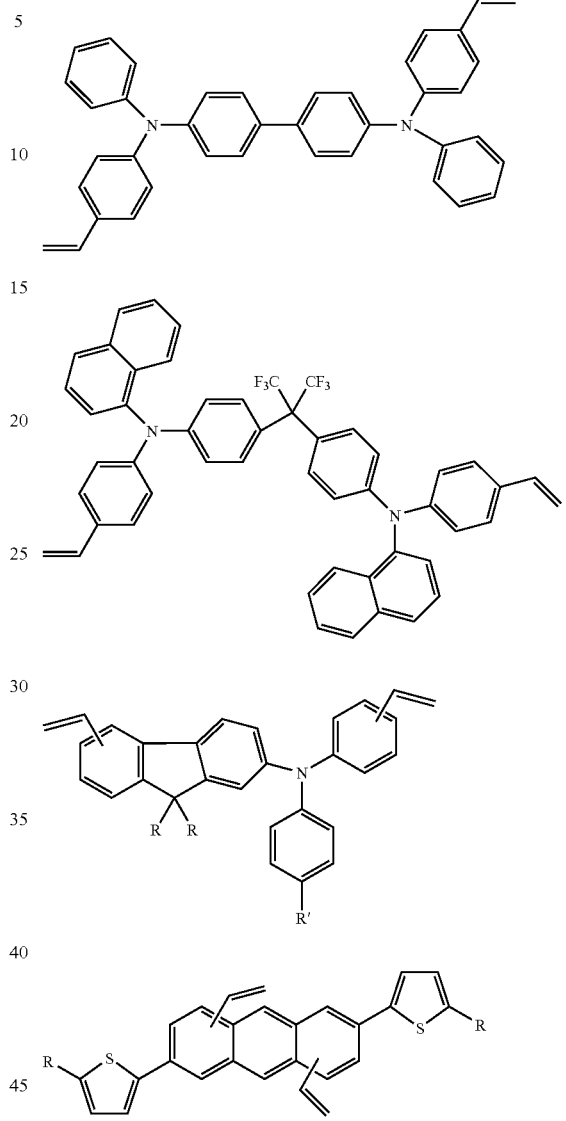

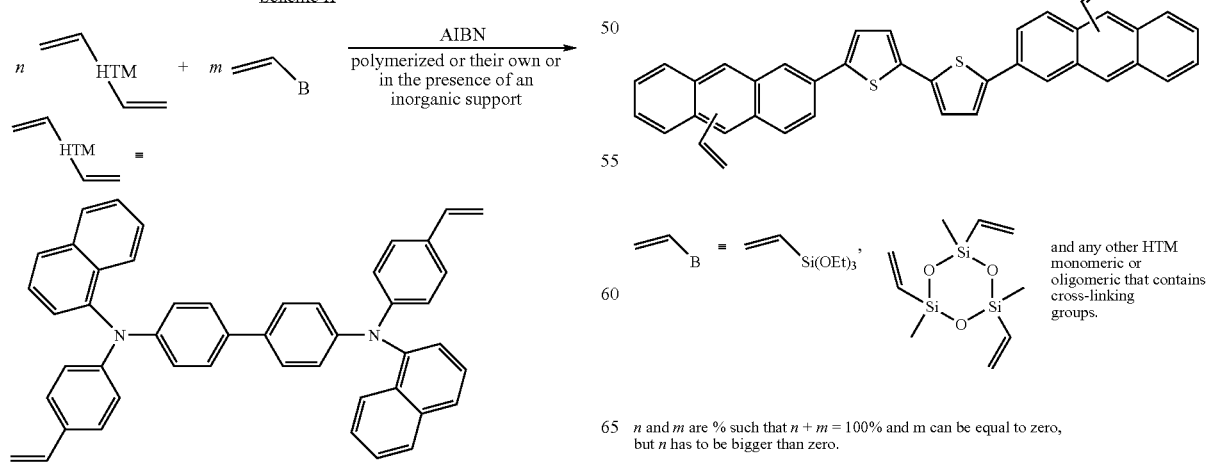

$n$ and $m$ are % such that $n + m = 100\%$ and $m$ can be equal to zero, but $n$ has to be bigger than zero.

Example 4A

A specific example is illustrated below:

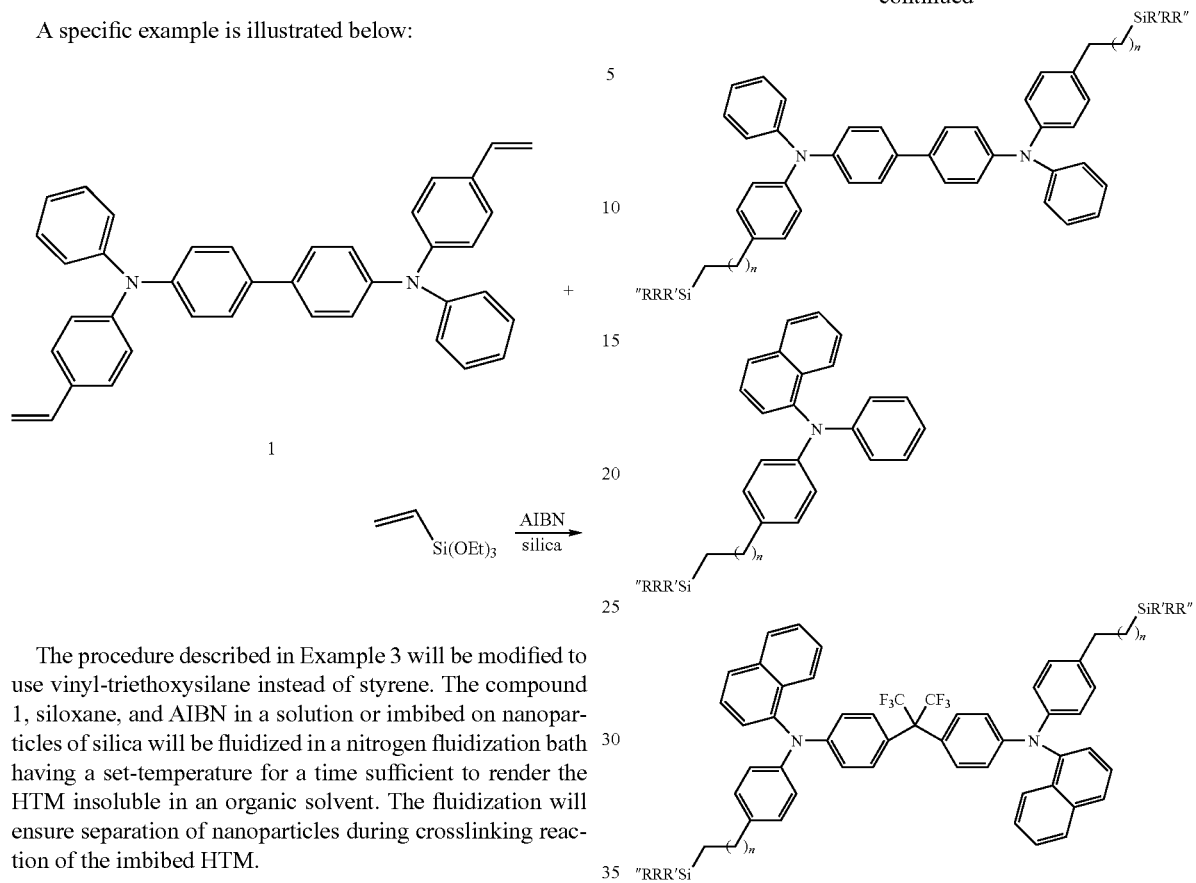

The procedure described in Example 3 will be modified to use vinyl-triethoxysilane instead of styrene. The compound 1, siloxane, and AIBN in a solution or imbibed on nanoparticles of silica will be fluidized in a nitrogen fluidization bath having a set-temperature for a time sufficient to render the HTM insoluble in an organic solvent. The fluidization will ensure separation of nanoparticles during crosslinking reaction of the imbibed HTM.

Scheme III shows a further variation where the HTM contains a group capable of attachment to the support (e.g. siloxane group). General scheme of chemistry and a list of possible hole-transporting materials and a specific example (Example 4B) are shown below.

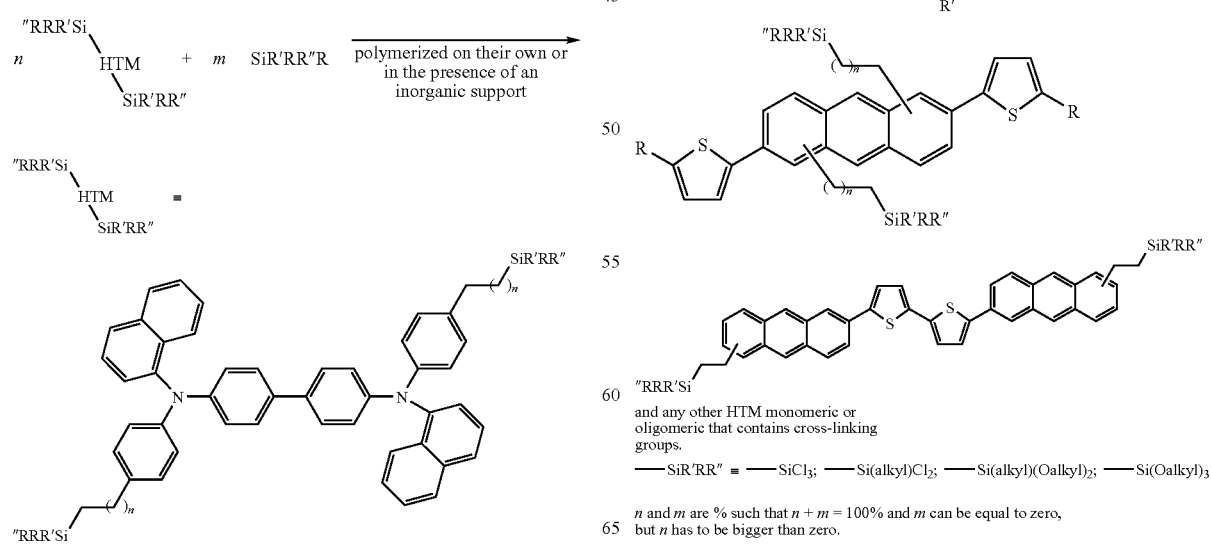

and any other HTM monomeric or oligomeric that contains cross-linking groups.

—SiR'RR" ≡ —SiCl$_3$; —Si(alkyl)Cl$_2$; —Si(alkyl)(Oalkyl)$_2$; —Si(Oalkyl)$_3$ $n$ and $m$ are % such that $n + m = 100\%$ and $m$ can be equal to zero, but $n$ has to be bigger than zero.

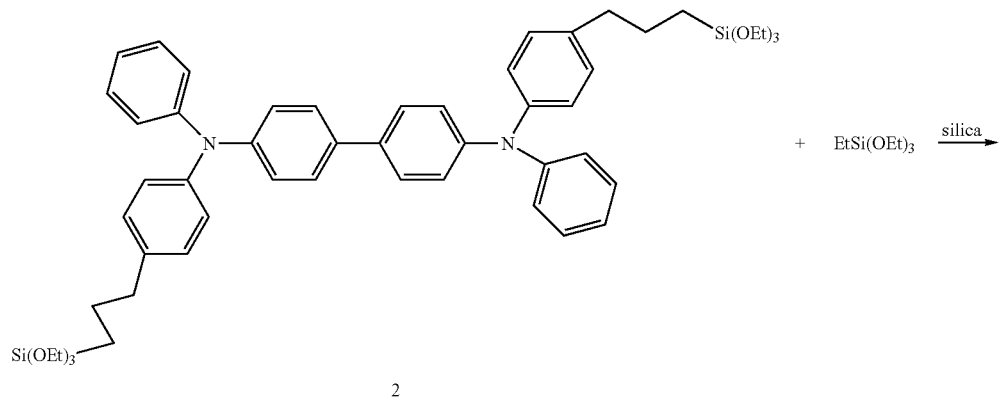

2

Synthesis of Compound 2.

The procedure reported by Marks et al. (*Advanced Materials* 2002, 14, 565) will modified using N,N'-di(4-allylphenyl)-N,N'-diphenyl-benzidine, HSi(OEt)$_3$ and H$_2$PtCl$_6$ to synthesize compound 2.

Condensation of 2 with EtSi(OEt)$_3$ and silica: The compound 2 (1.00 g, 1.1 mmol), HSi(OEt)$_3$ (0.1 g) and silica (1.00 g) in a toluene solution or imbibed on nanoparticles of silica will be fluidized in a nitrogen fluidization bath having a set-temperature for a time sufficient to render the HTM insoluble in an organic solvent. The fluidization will ensure separation of nanoparticles during crosslinking reaction of the imbibed HTM.

The crosslinking groups above are not limited to vinyl or allyl moieties. Other crosslinking groups can be used, such as acrylates or OCN.

Scheme IV shows a further variation where the HTM contains a group capable of attachment to the support (e.g. siloxane group). General scheme of chemistry and a list of possible hole-transporting materials are shown above. A specific example (Example 4C) is shown below.

Scheme IV

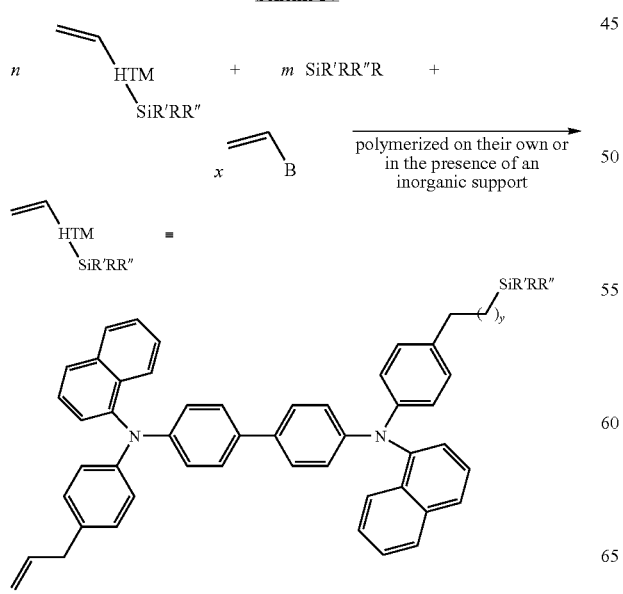

-continued

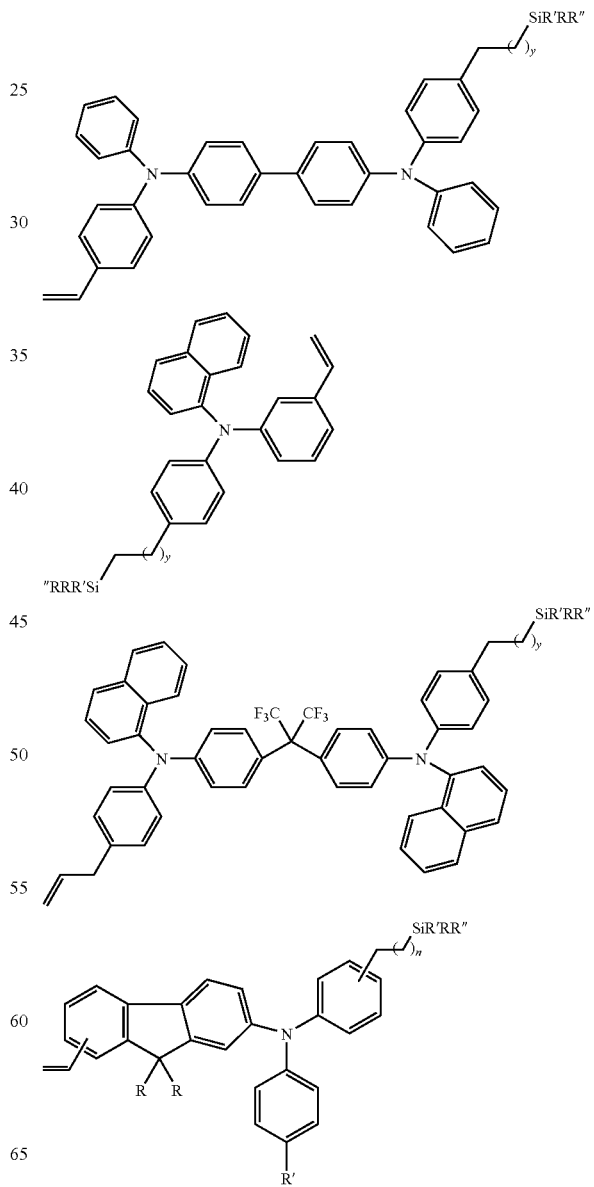

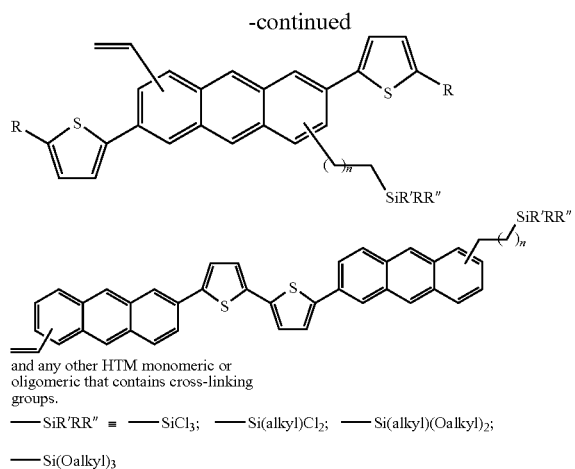

and any other HTM monomeric or oligomeric that contains cross-linking groups.

——SiR'RR" ≡ ——SiCl$_3$; ——Si(alkyl)Cl$_2$; ——Si(alkyl)(Oalkyl)$_2$;

——Si(Oalkyl)$_3$ $n$, $m$ and $x$ are % such that $n + m + x = 100\%$ and $m$ and $x$ can be equal to zero, but $n$ has to be bigger than zero. $y$ can be any integer Example 4C The procedure described in Example 3 will be modified to use compound 3, vinyl-triethoxysilane and HSi(OEt)$_3$.

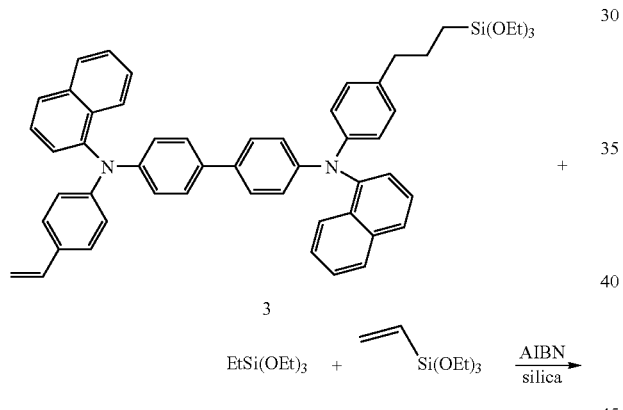

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Many aspects and embodiments have been described above and are merely exemplary and not limiting. After reading this specification, skilled artisans appreciate that other aspects and embodiments are possible without departing from the scope of the invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:
1. A composition comprising:
at least one monomer of the formula:

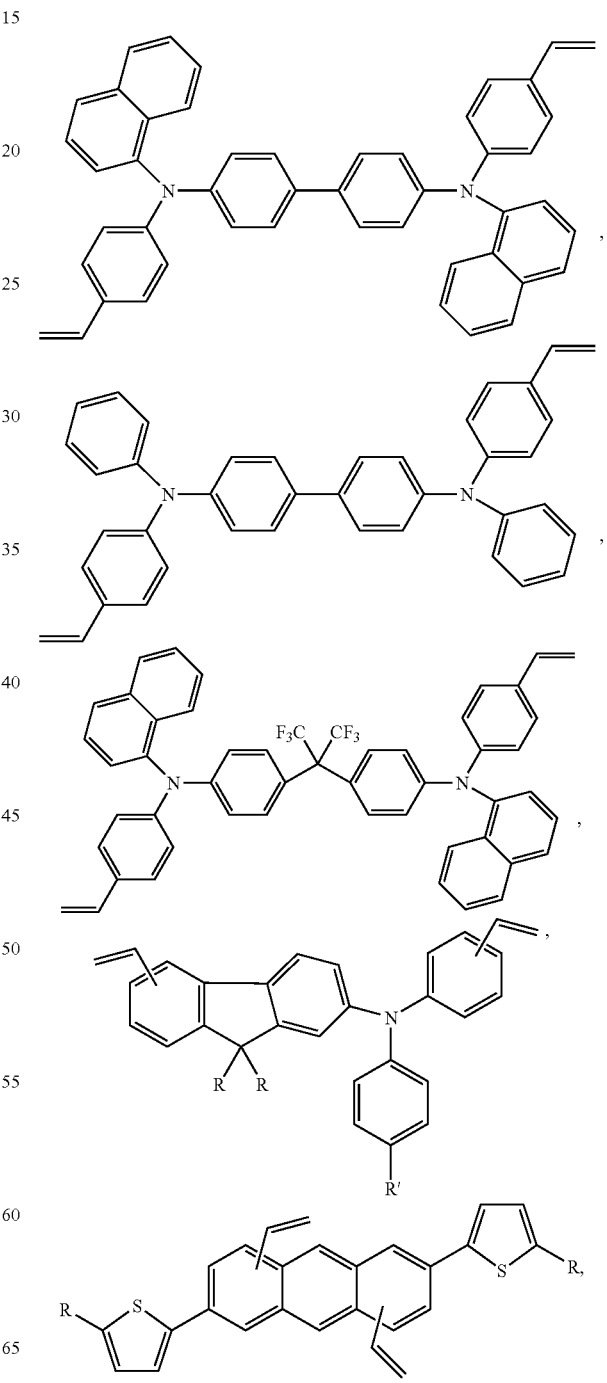

-continued
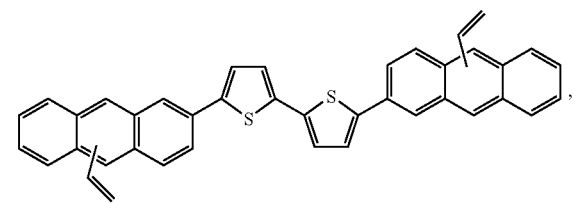
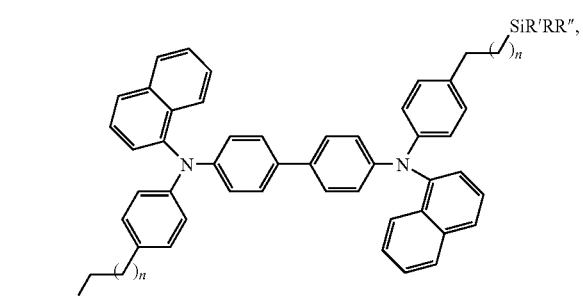
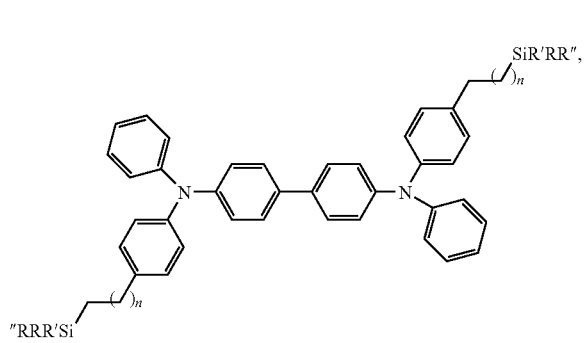
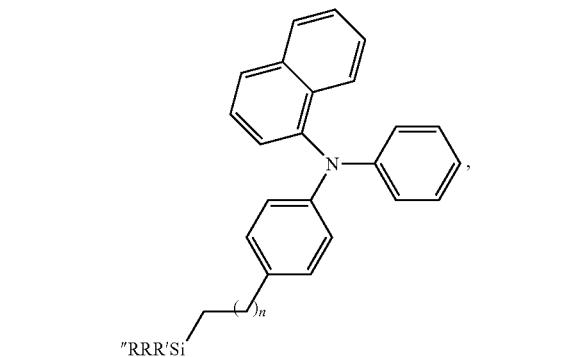
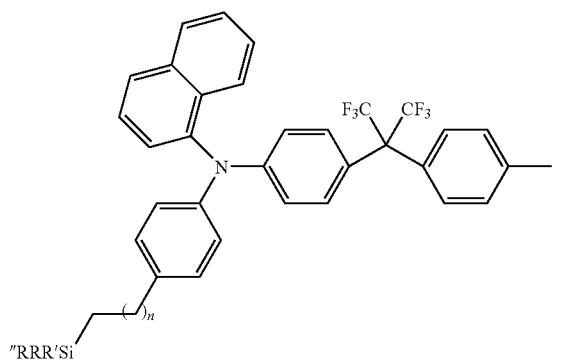
-continued
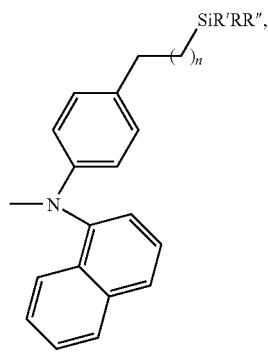
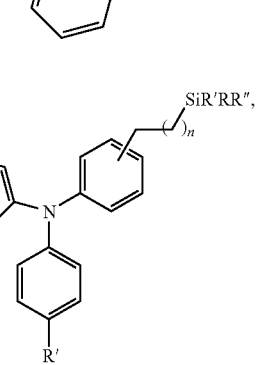
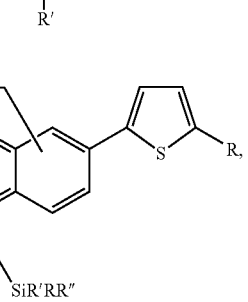
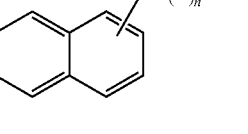
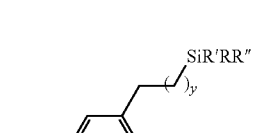
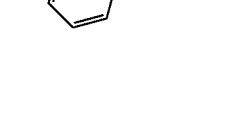

-continued

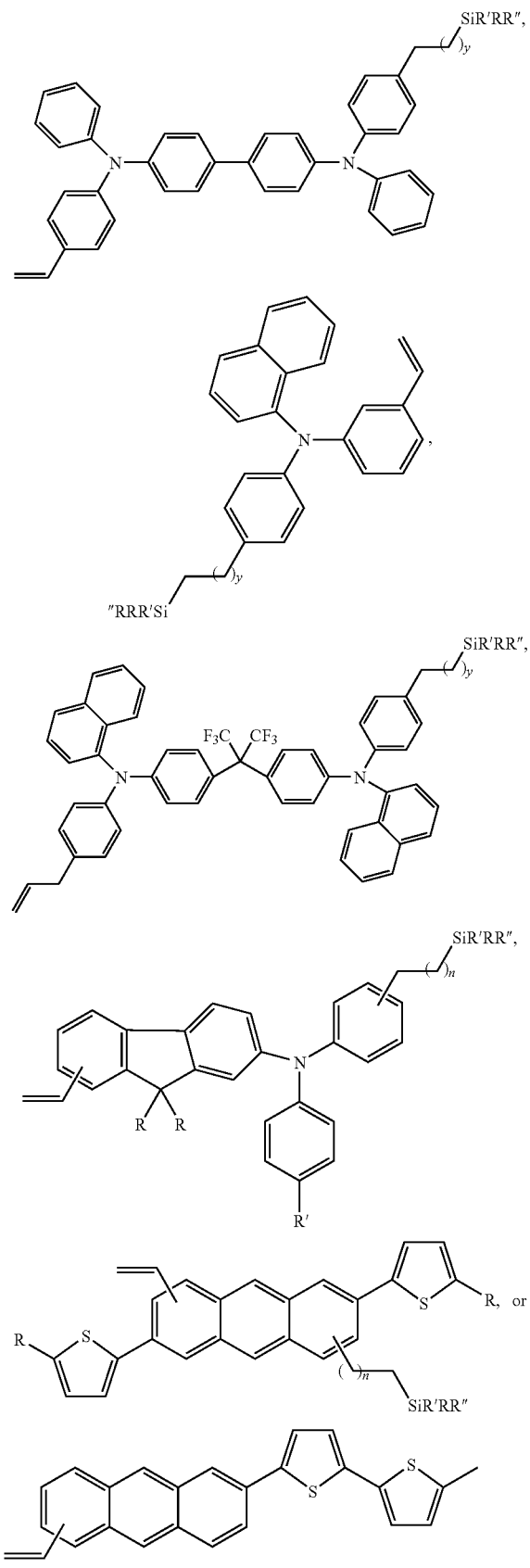

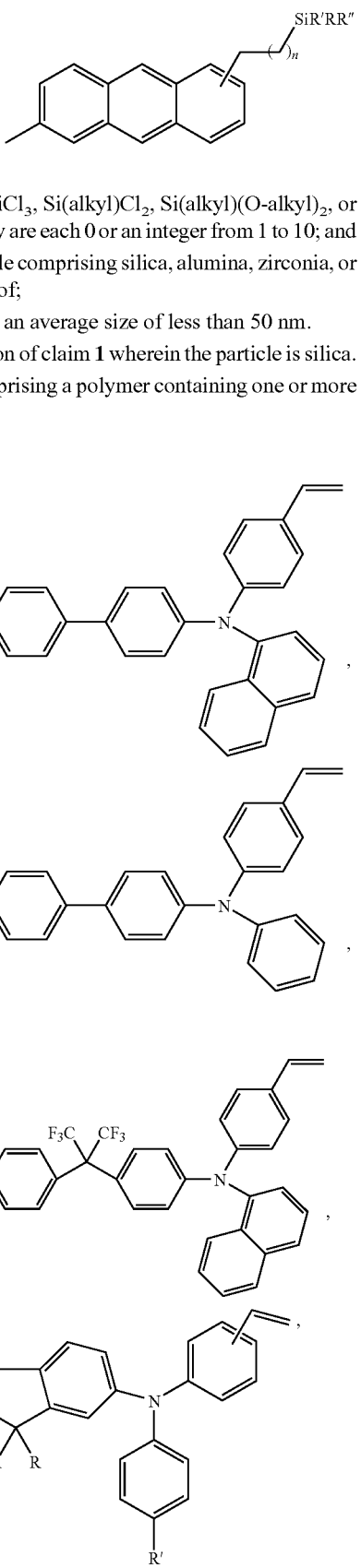

where SiR'RR" is $SiCl_3$, $Si(alkyl)Cl_2$, $Si(alkyl)(O\text{-}alkyl)_2$, or $Si(O\text{-}alkyl)_3$; n and y are each 0 or an integer from 1 to 10; and at least one particle comprising silica, alumina, zirconia, or mixtures thereof;

said particle having an average size of less than 50 nm.

2. The composition of claim 1 wherein the particle is silica.

3. A particle comprising a polymer containing one or more monomers that are:

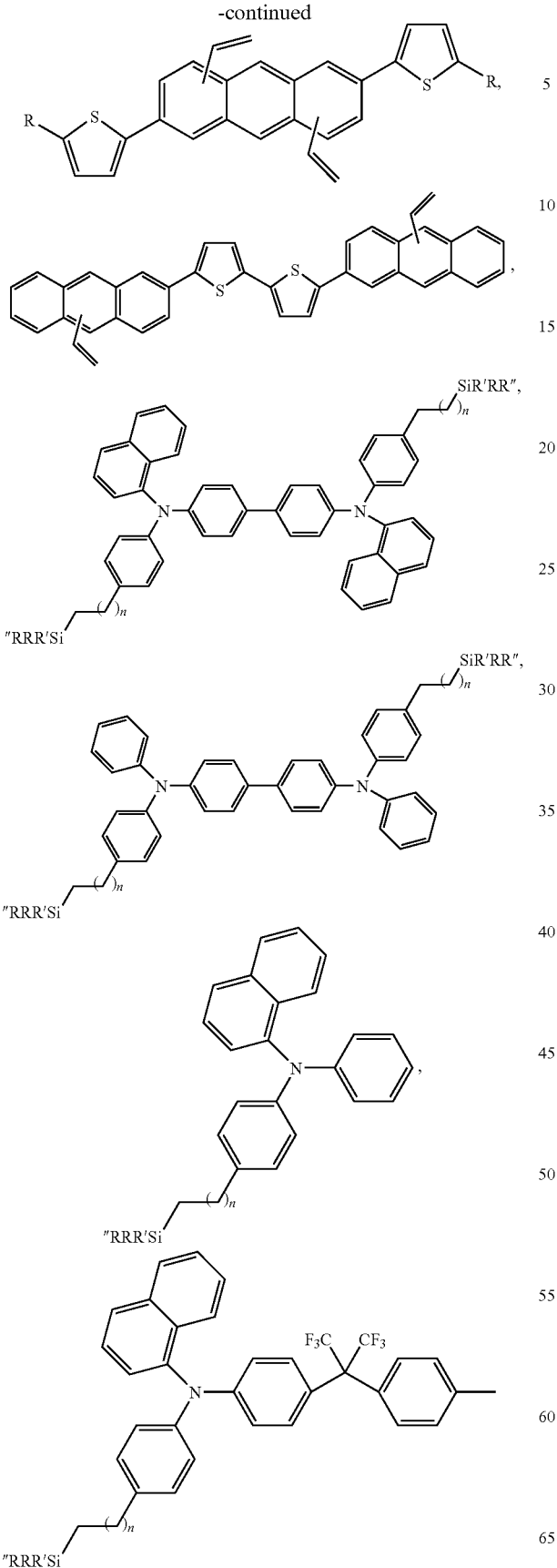
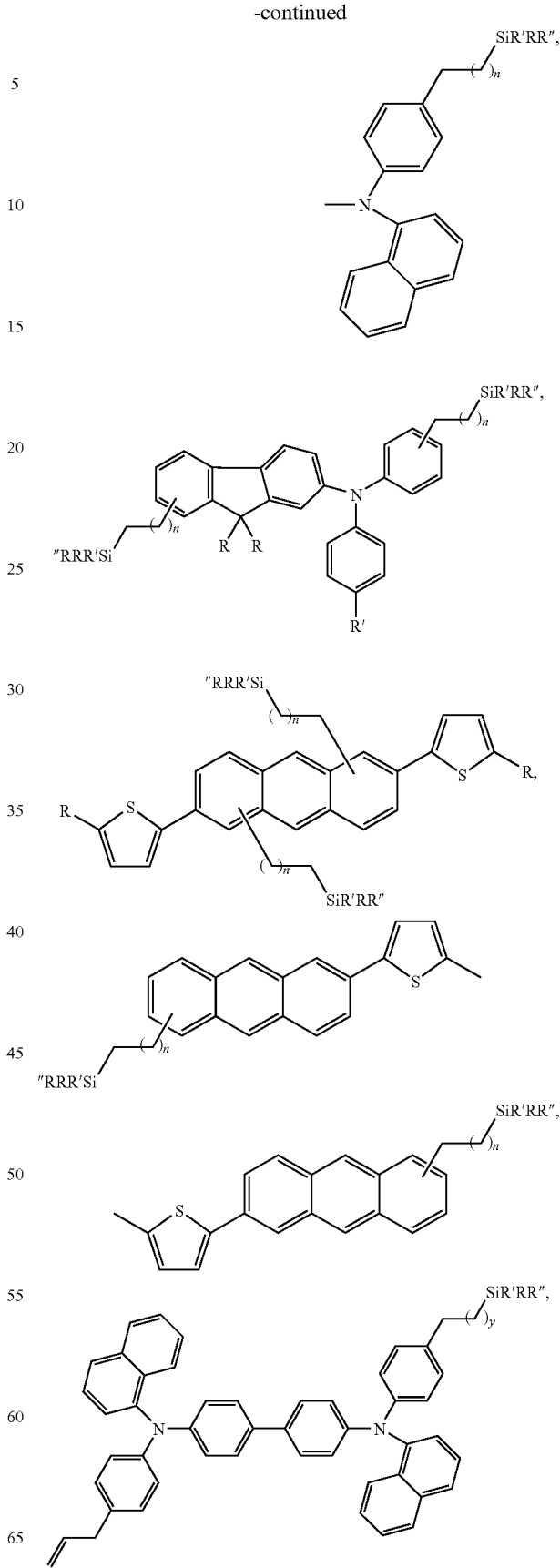

-continued
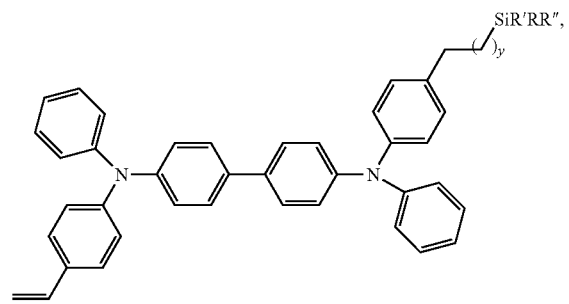
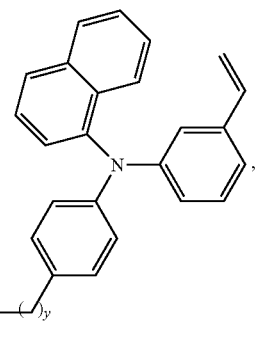
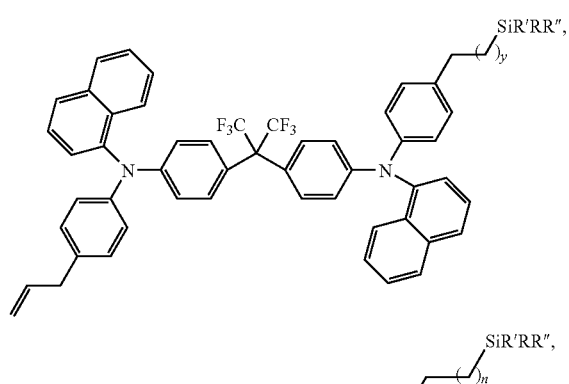
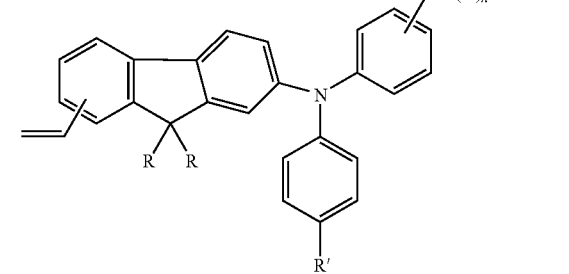
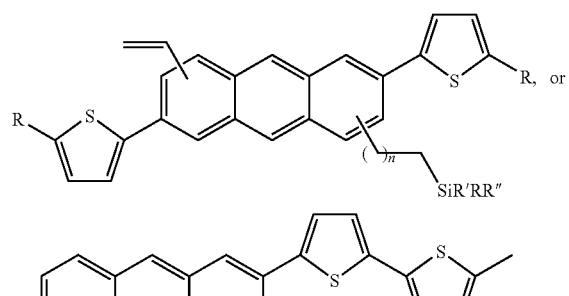
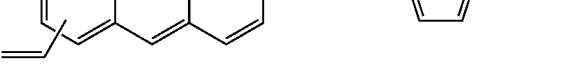
-continued
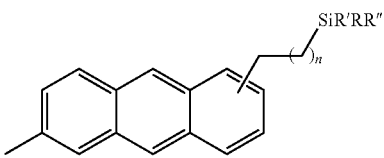
where SiR'RR" is $SiCl_3$, $Si(alkyl)Cl_2$, $Si(alkyl)(O\text{-}alkyl)_2$, or $Si(O\text{-}alkyl)_3$; n and y are each 0 or an integer from 1 to 10; and wherein said particle is has an average particle size of less than 50 nm.
4. A composition comprising a particle having a polymer coating disposed thereon, said polymer coating containing one or more monomers that are:
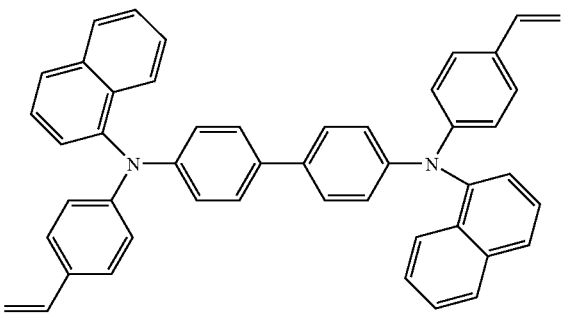
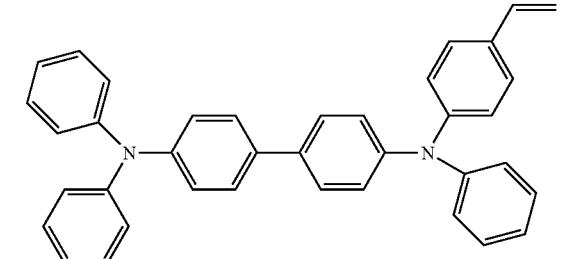
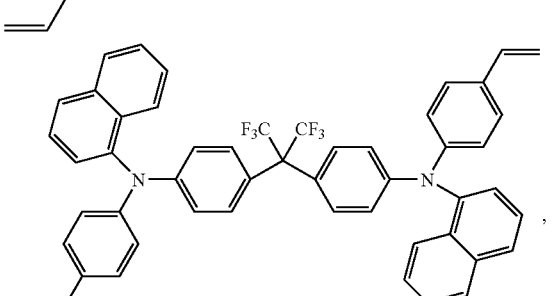
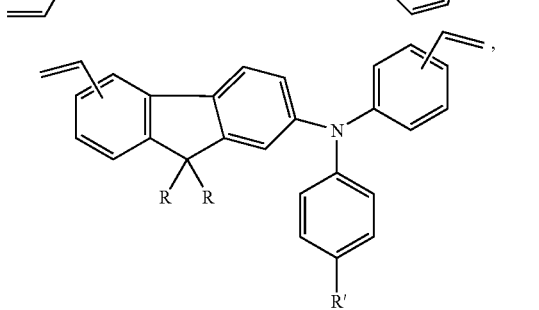

-continued
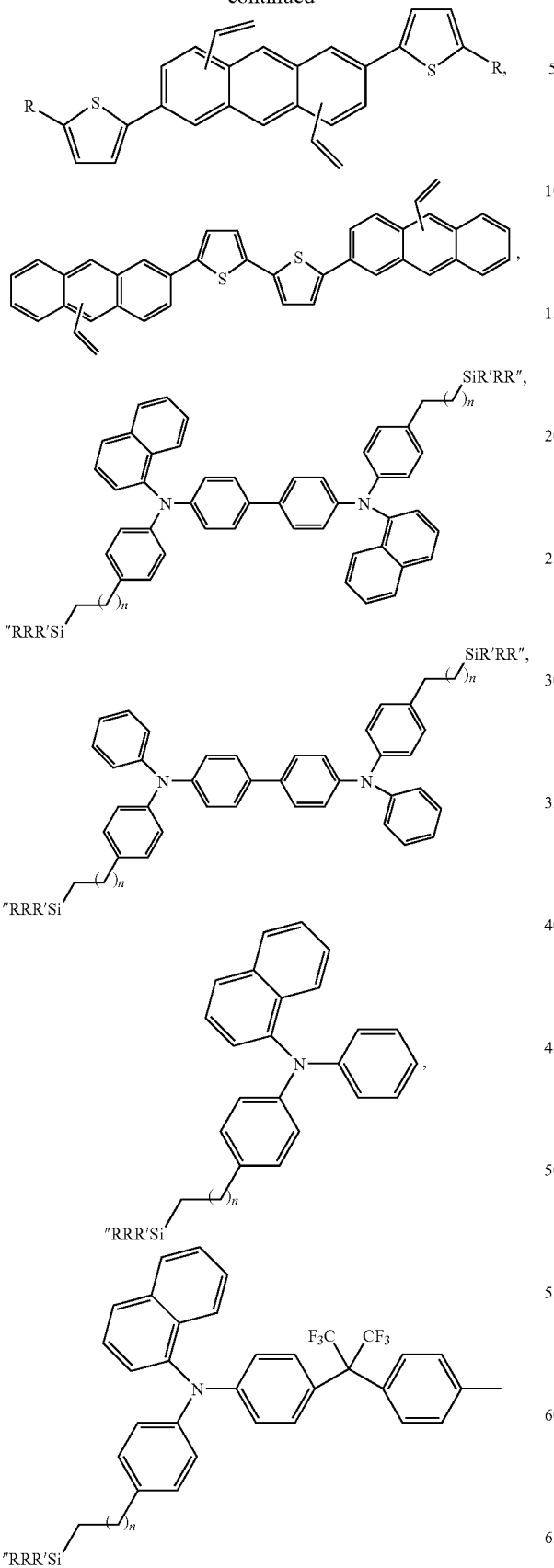
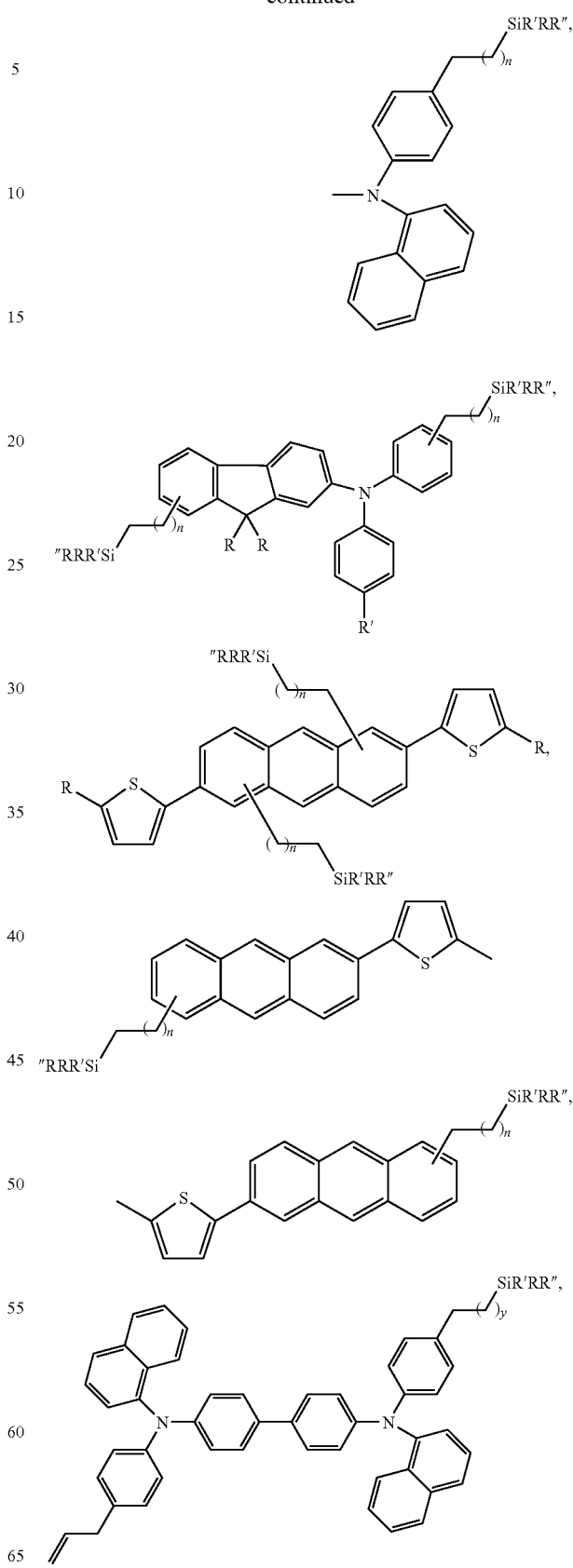

-continued

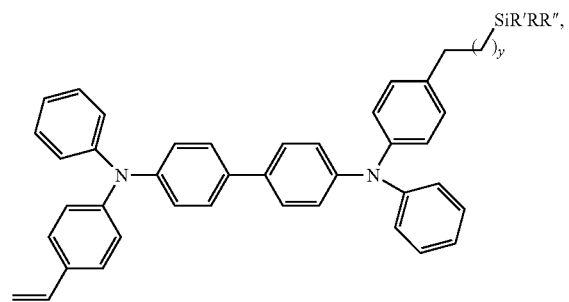

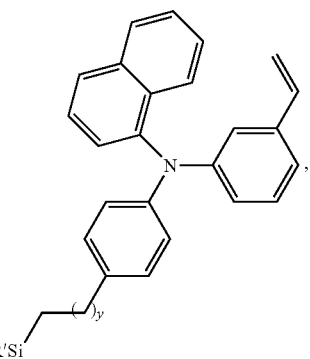

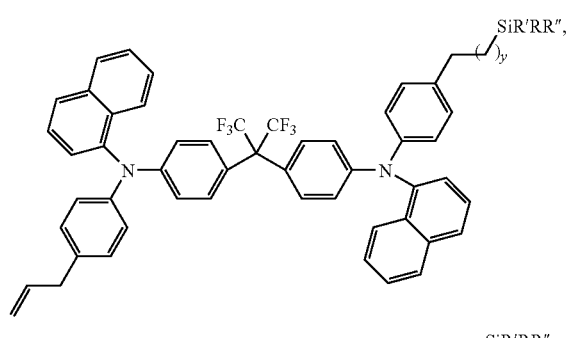

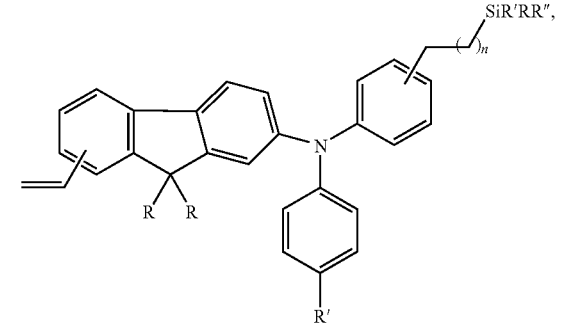

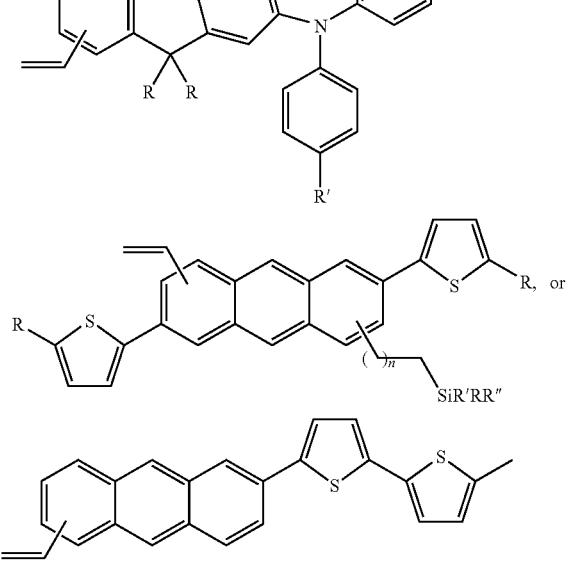

-continued

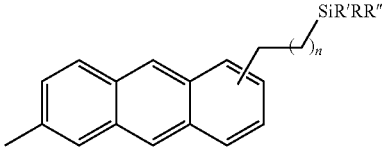

where SiR'RR" is $SiCl_3$, $Si(alkyl)Cl_2$, $Si(alkyl)(O\text{-alkyl})_2$, or $Si(O\text{-alkyl})_3$; n and y are each 0 or an integer from 1 to 10; said particle having an average size of less than 50 nm.

5. The composition of claim 4 wherein the particle is silica, alumina, or zirconia.

6. The composition of claim 4 wherein the particle is silica.

7. The composition of claim 4, wherein the average size of the particles is less than 10 nm.

8. The composition of claim 4 where the monomer is:

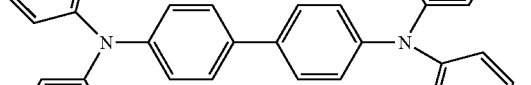

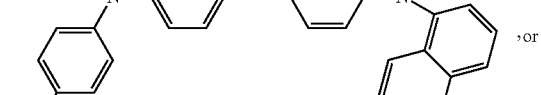

9. The composition of claim 4 where the monomer is:
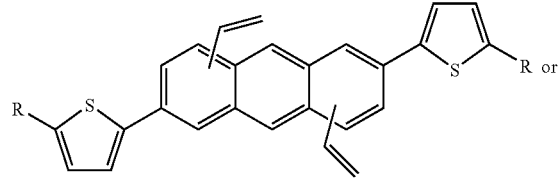
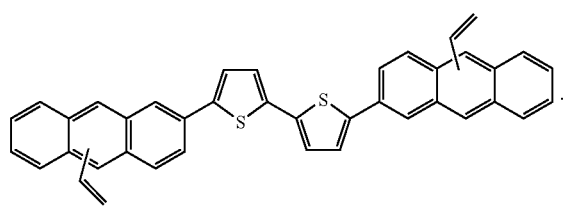
10. The composition of claim 4 where the monomer is:
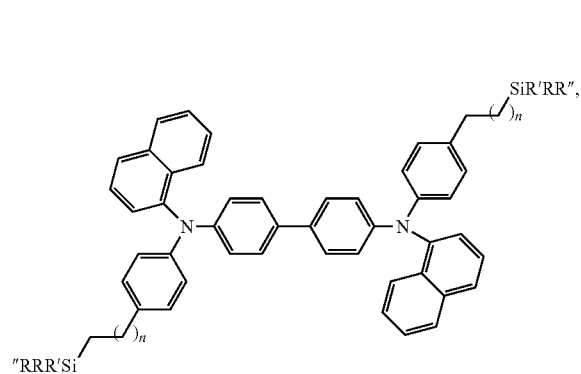
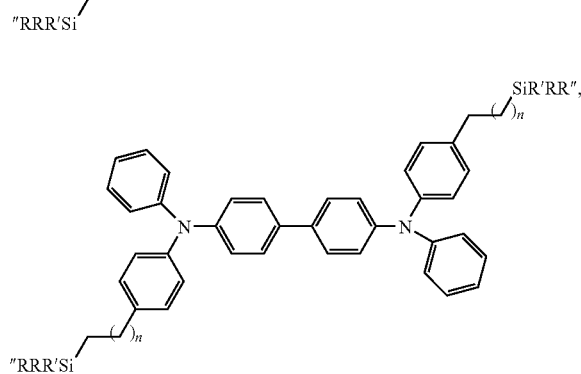
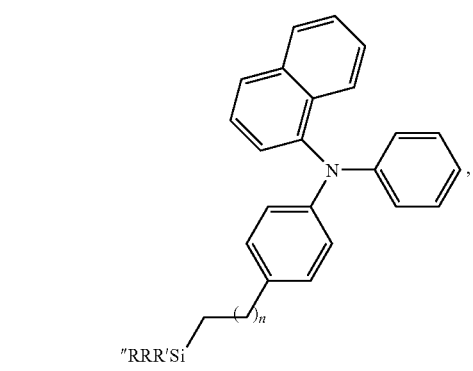
-continued
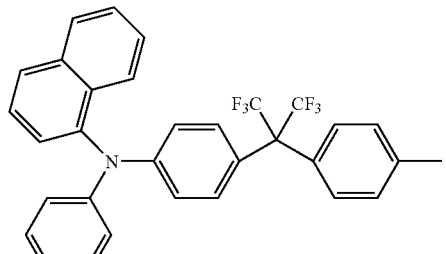
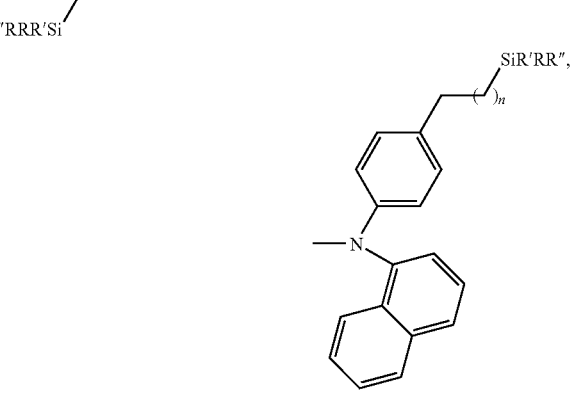

where:
SiR'RR" is SiCl₃, Si(alkyl)Cl₂, Si(alkyl)(O-alkyl)₂, or Si(O-alkyl)₃;
n and y are each 0 or an integer from 1 to 10.

11. The composition of claim 4 where the monomer is:

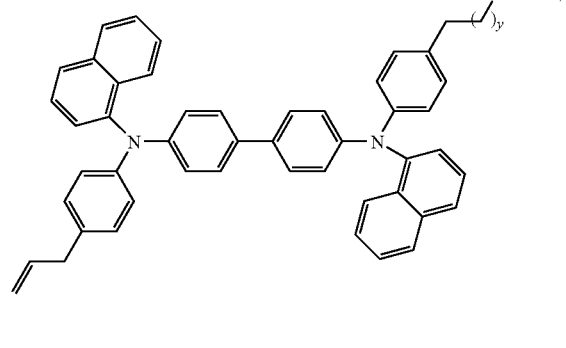

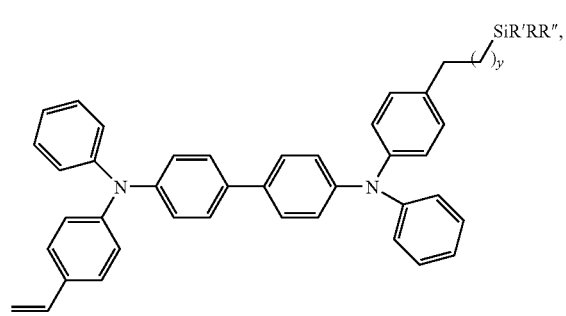

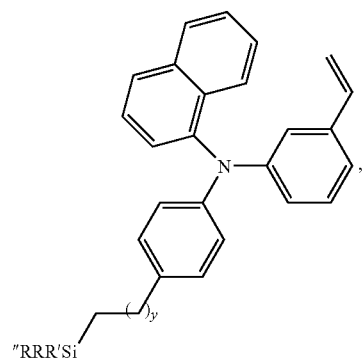

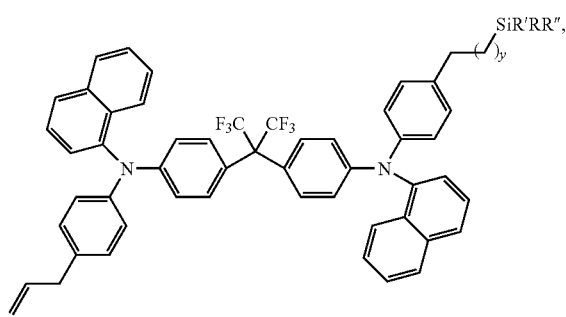

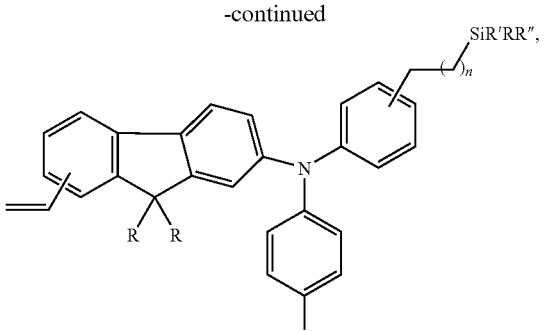

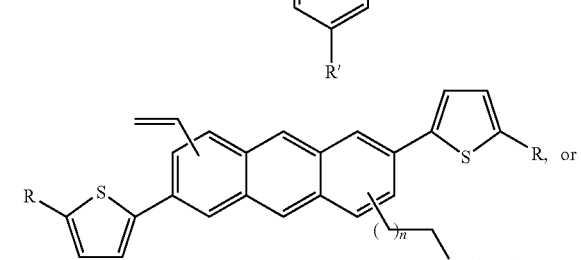

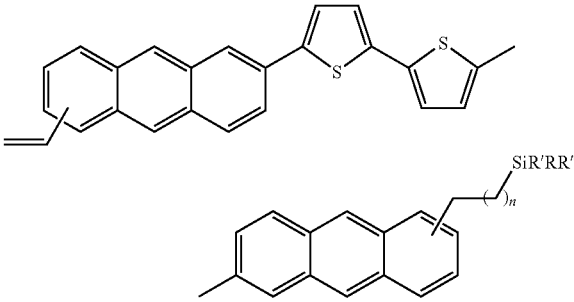

where SiR'RR" is SiCl₃, Si(alkyl)Cl₂, Si(alkyl)(O-alkyl)₂, or Si(O-alkyl)₃;
n and y are each 0 or an integer from 1 to 10.

12. An electronic device which comprises at least one layer which comprises at least one compound of claim 4.

13. A composition comprising the composition of claim 4 and at least one solvent, processing aid, charge transporting material, or charge blocking material.

14. A method of forming a cross-linked charge transport material comprising:
   a. providing a cross-linkable charge transport monomer; and
   b. causing said monomer to crosslink optionally in the presence of inorganic oxide particles; said particles having an average size of less than 50 nm.

15. The method of claim 14 wherein the monomer comprises:

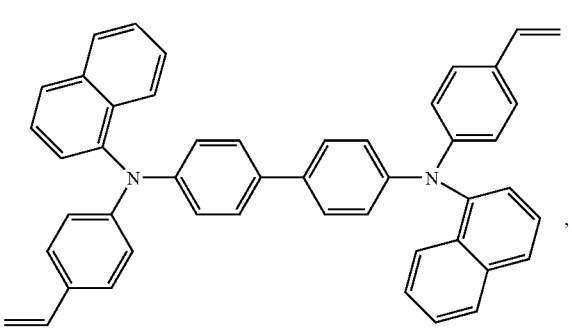

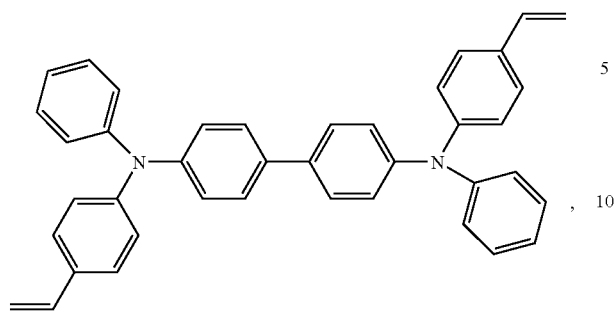
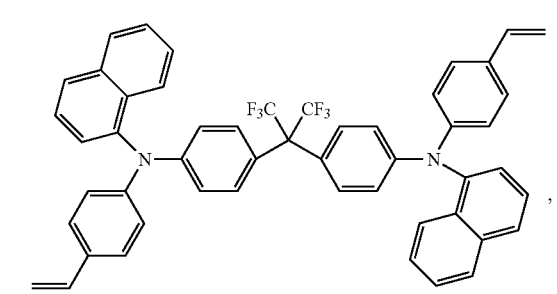
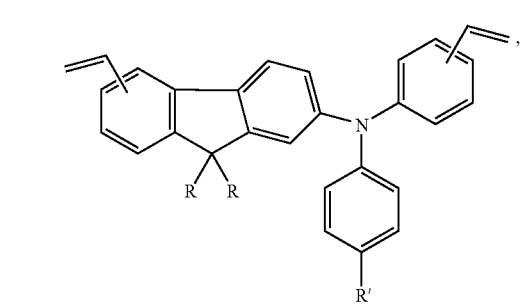
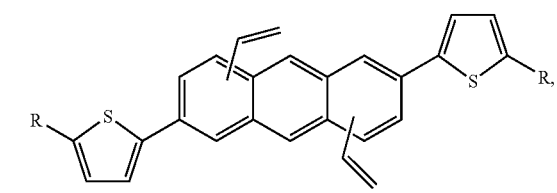
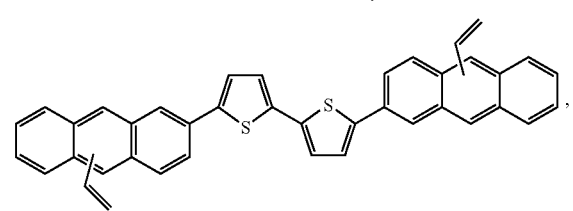
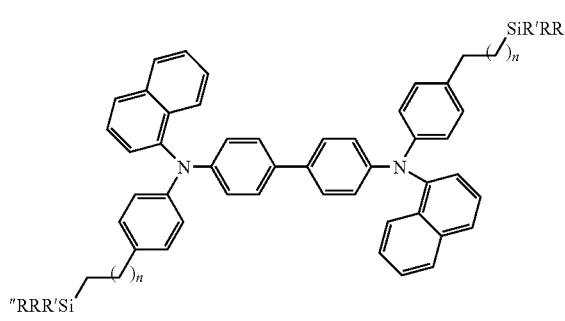
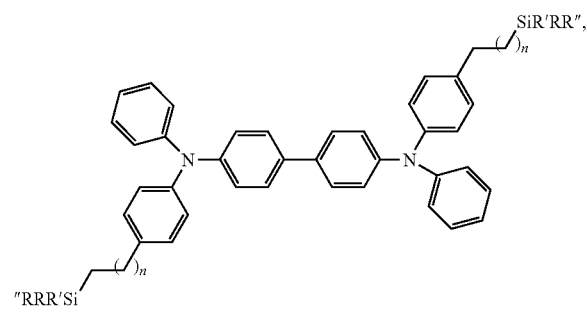
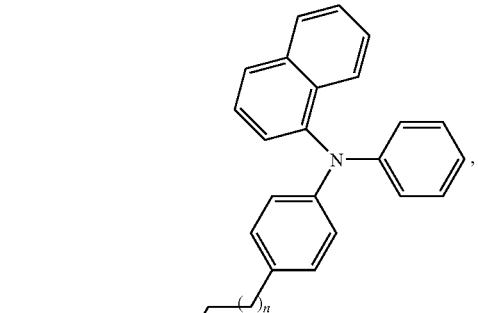
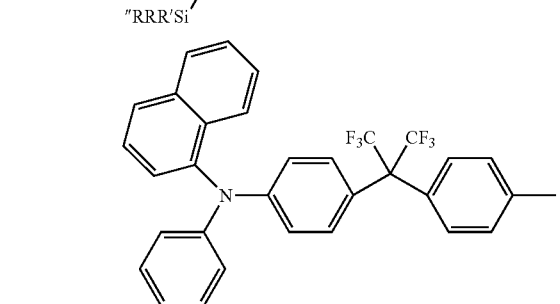
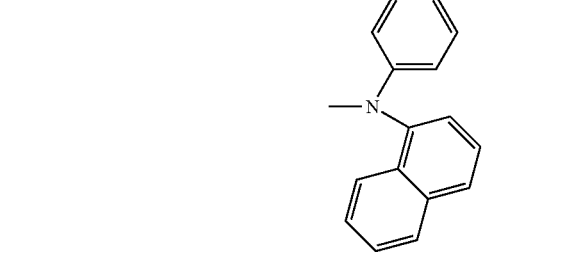
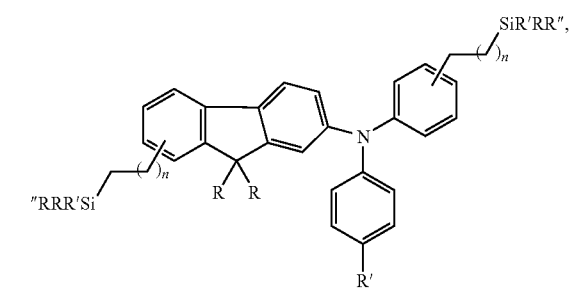

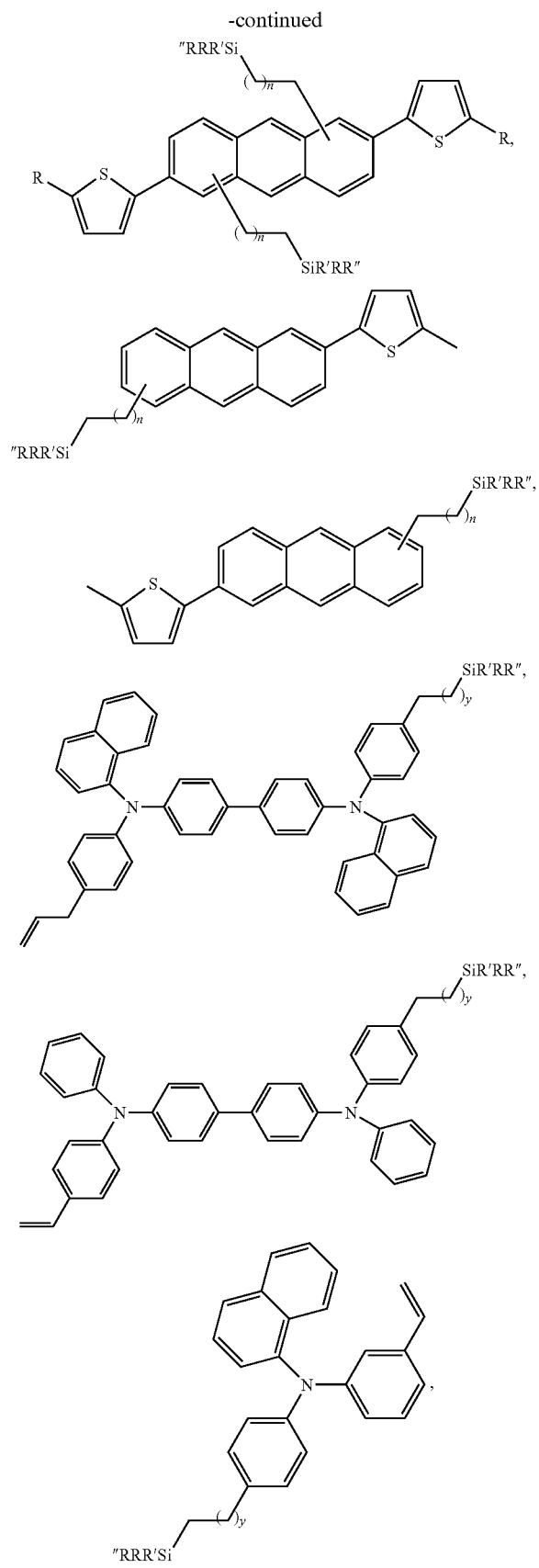

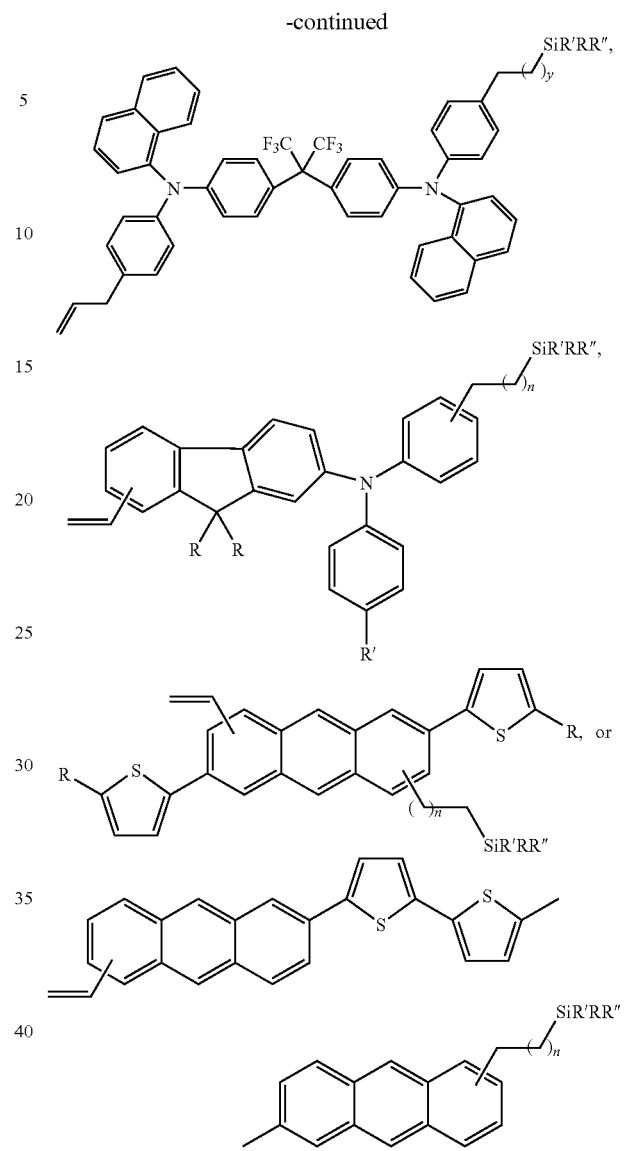

where SiR'RR" is SiCl$_3$, Si(alkyl)Cl$_2$, Si(alkyl)(O-alkyl)$_2$, or Si(O-alkyl)$_3$; n and y are each 0 or an integer from 1 to 10.

16. The method of claim 15 where is silica, alumina, or zirconia.

17. An article useful in the manufacture of an organic electronic device, comprising the composition of claim 4.

18. A composition comprising:

at least one monomer of the formula:

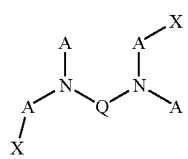

wherein:
each A is independently phenyl or naphthyl;

Q is

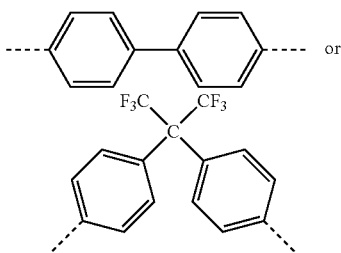 or where the dashed line indicated to site of bonding to the nitrogen atom of the monomer;

X is —CH=CH$_2$ or —CH$_2$—(CH$_2$)$_y$—SiR'RR";

where SiR'RR" is SiCl$_3$, Si(alkyl)Cl$_2$, Si(alkyl)(O-alkyl)$_2$, or Si(O-alkyl)$_3$; n and y are each 0 or an integer from 1 to 10; and at least one particle comprising silica, alumina, zirconia, or mixtures thereof;

said particle having an average size of less than 50 nm.

19. The composition of claim 18, wherein said monomer is of the formula

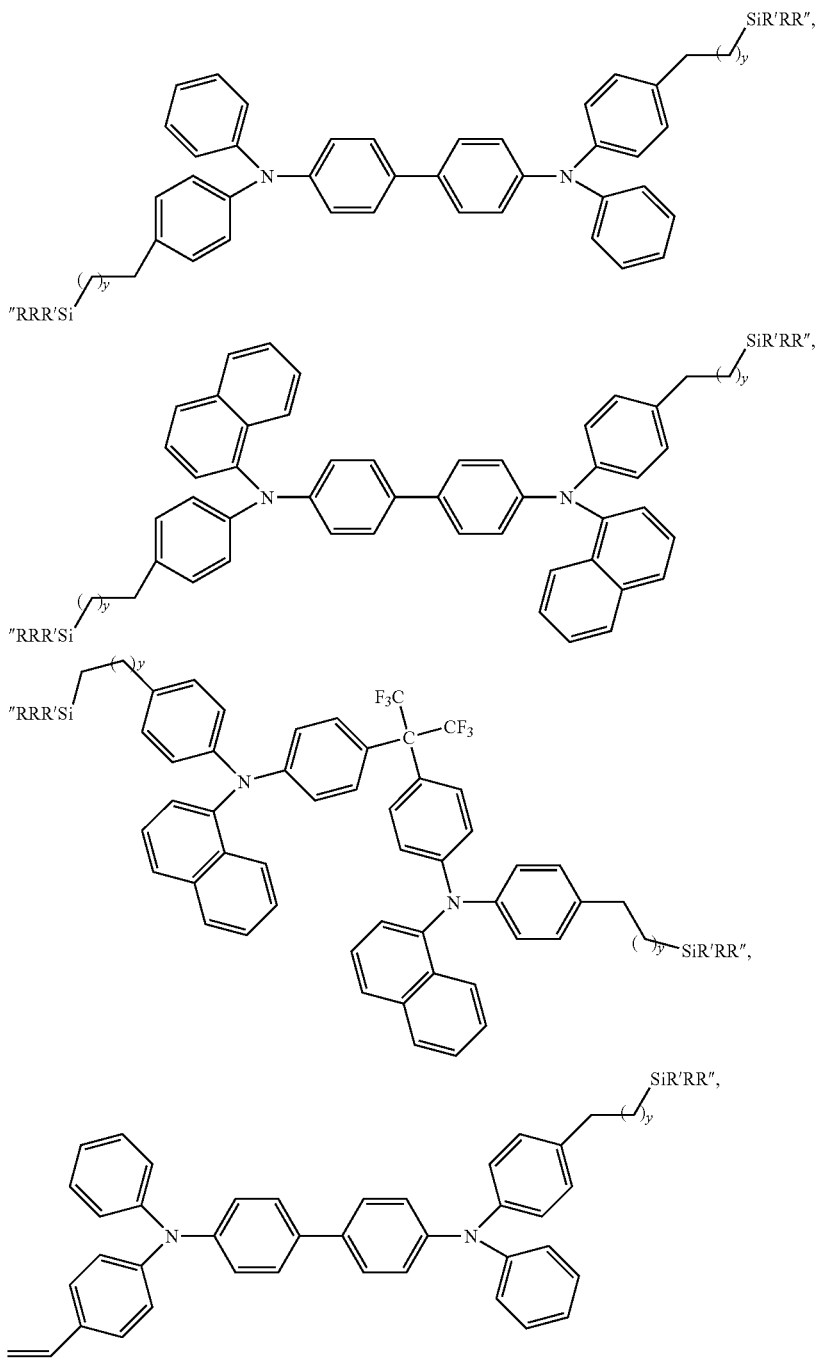

-continued
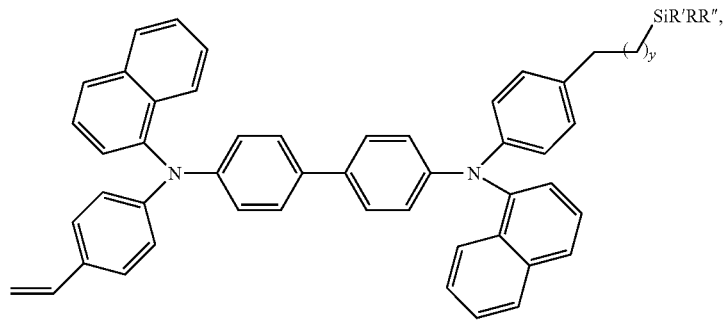
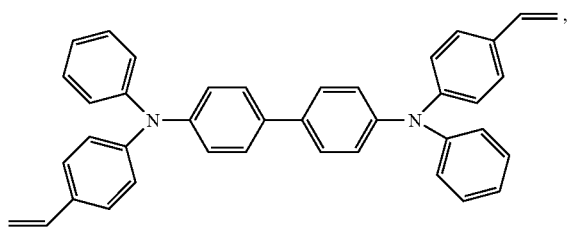
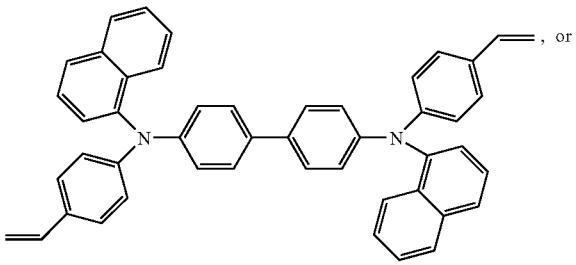
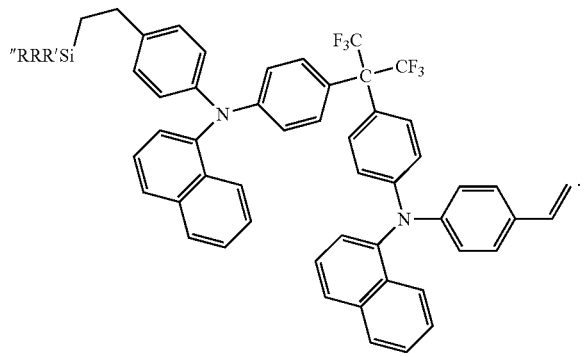
20. A composition comprising a particle having a polymer coating disposed thereon, said polymer coating containing derivatives of one or more monomers of the formula:
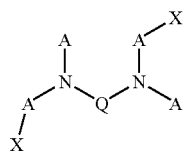
wherein:
each A is independently phenyl or naphthyl;
Q is
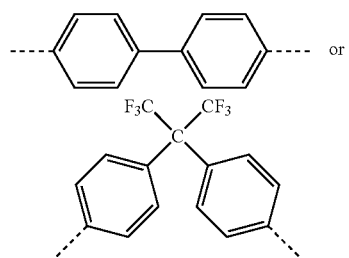

where the dashed line indicated to site of bonding to the nitrogen atom of the monomer;

X is —CH=CH$_2$ or —CH$_2$—(CH$_2$)$_y$—SiR'RR";

where SiR'RR" is SiCl$_3$, Si(alkyl)Cl$_2$, Si(alkyl)(O-alkyl)$_2$, or Si(O-alkyl)$_3$; n and y are each 0 or an integer from 1 to 10; and at least one particle comprising silica, alumina, zirconia, or mixtures thereof;

said particle having an average size of less than 50 nm.

21. The composition of claim 20 comprising at least one monomer of the formula:

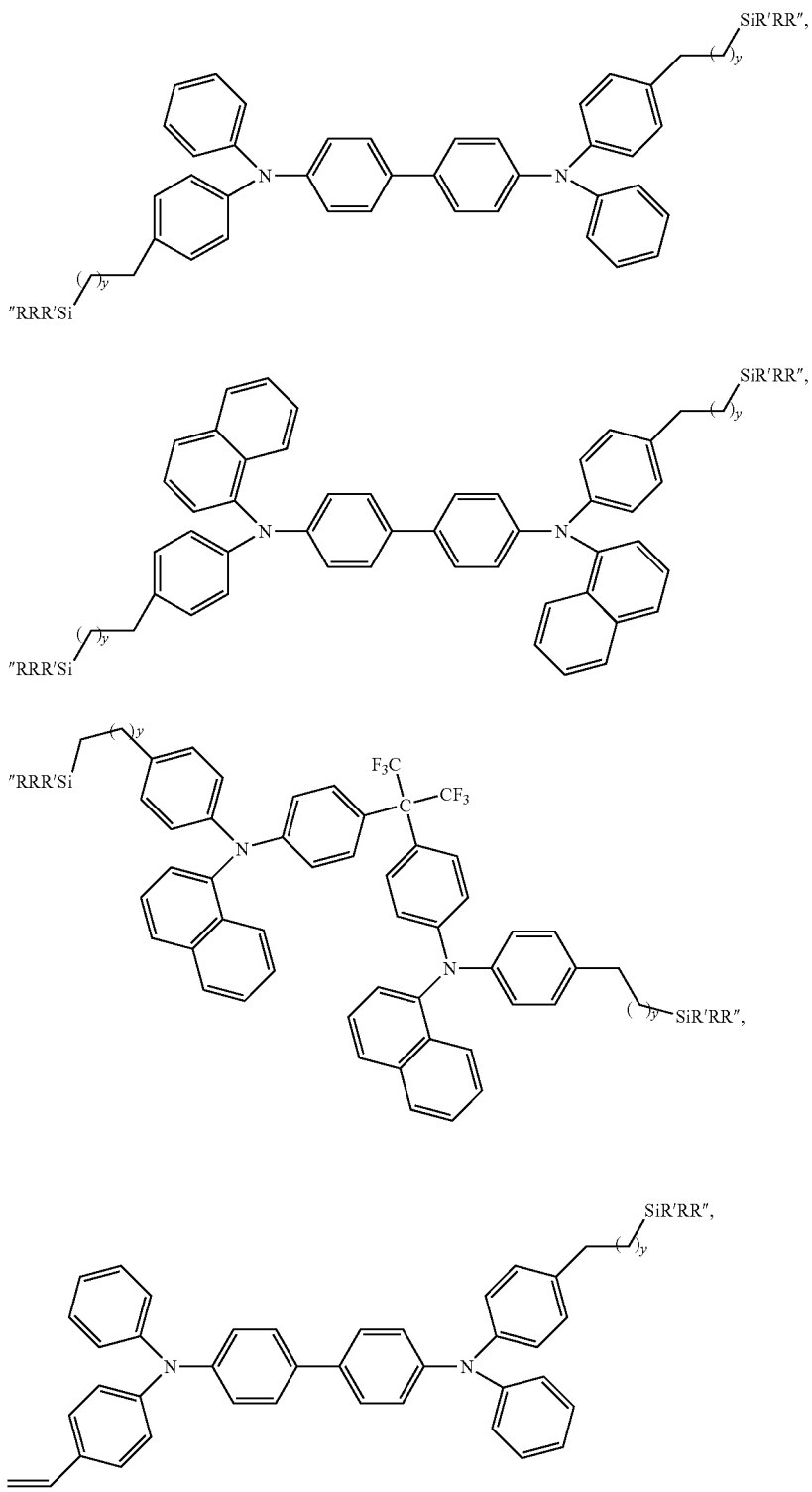

-continued
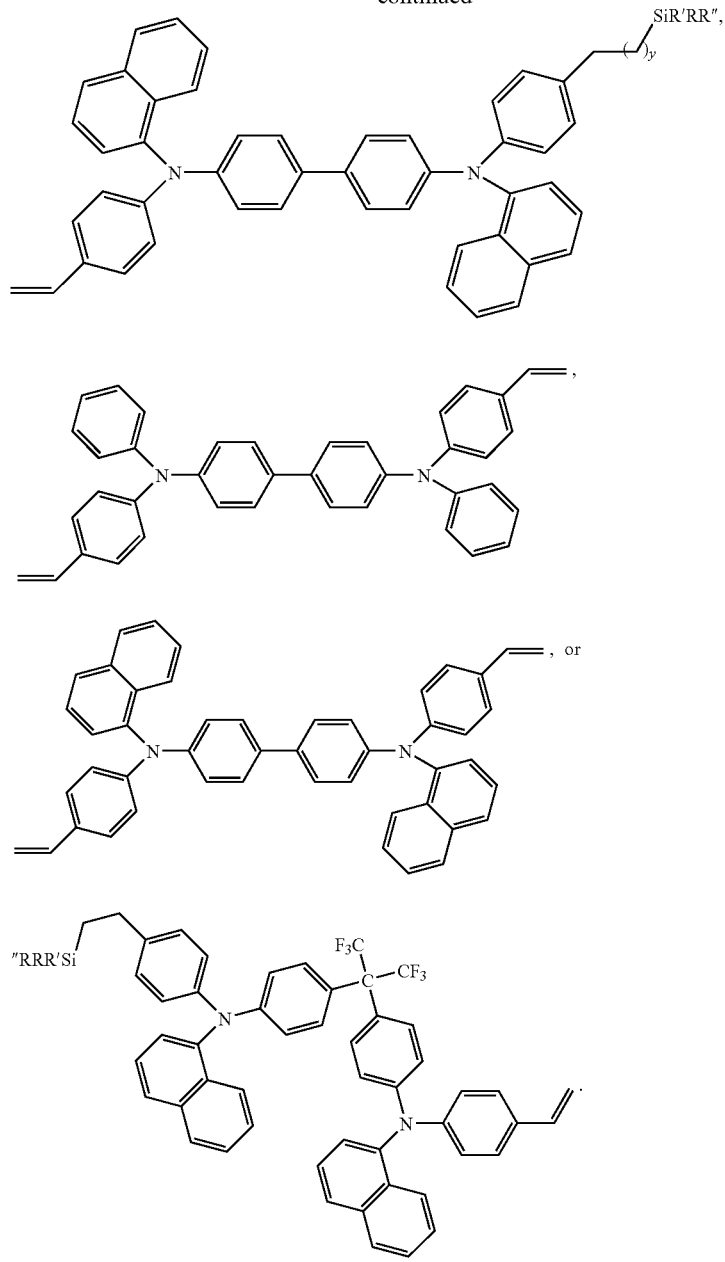
22. A method of forming a cross-linked charge transport material comprising:
(a) providing a cross-linkable charge transport monomer of the formula
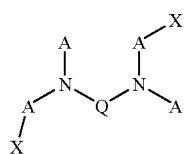
wherein:
each A is independently phenyl or naphthyl;
Q is
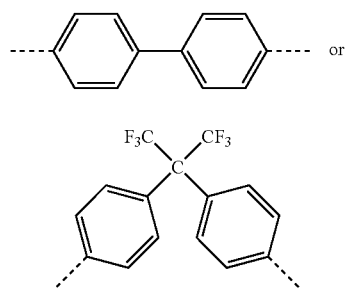

where the dashed line indicated to site of bonding to the nitrogen atom of the monomer;

X is —CH=CH$_2$ or —CH$_2$—(CH$_2$)$_y$—SiR'RR";

where SiR'RR" is SiCl$_3$, Si(alkyl)Cl$_2$, Si(alkyl)(O-alkyl)$_2$, or Si(O-alkyl)$_3$; n and y are each 0 or an integer from 1 to 10; and at least one particle comprising silica, alumina, zirconia, or mixtures thereof; and (b) causing said monomer to crosslink optionally in the presence of inorganic oxide particles; said particles having an average size of less than 50 nm.

23. The method of claim 22, wherein said monomer is of the formula

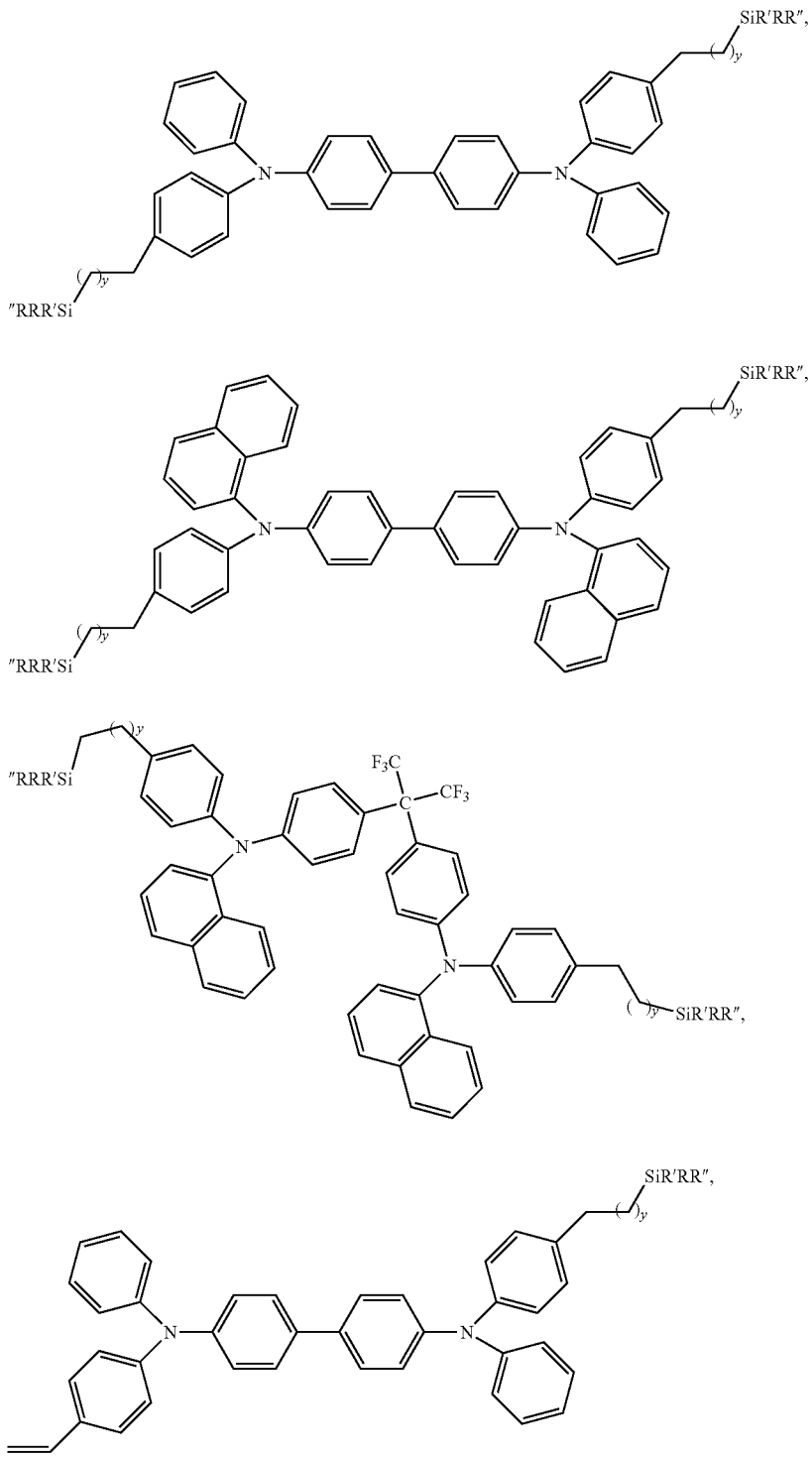

-continued
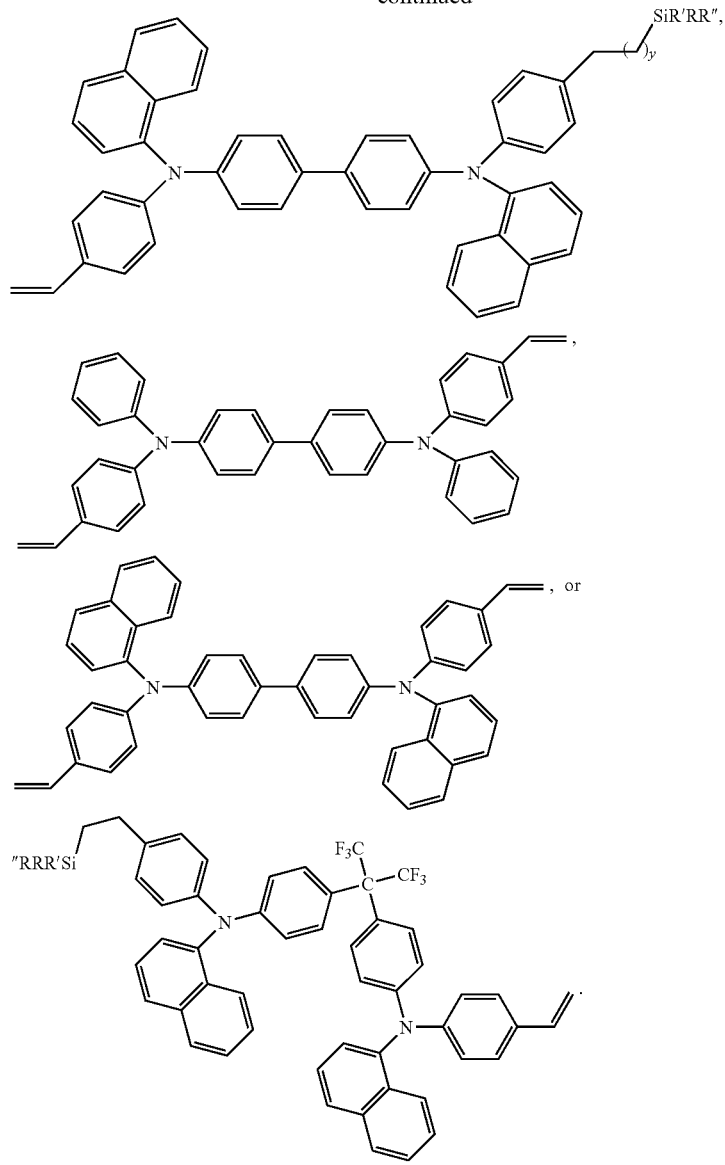
* * * * *